United States Patent
Chang et al.

(10) Patent No.: US 12,334,444 B2
(45) Date of Patent: *Jun. 17, 2025

(54) SEMICONDUCTOR PACKAGE STRUCTURE AND METHOD FOR FORMING THE SAME

(71) Applicant: MediaTek Inc., Hsin-Chu (TW)

(72) Inventors: Po-Hao Chang, New Taipei (TW); Yi-Jou Lin, Hsinchu (TW); Hung-Chuan Chen, Hsin-Chu (TW)

(73) Assignee: MEDIATEK INC., Hsinchu (TW)

( * ) Notice: Subject to any disclaimer, the term of this patent is extended or adjusted under 35 U.S.C. 154(b) by 518 days.

This patent is subject to a terminal disclaimer.

(21) Appl. No.: 17/718,454

(22) Filed: Apr. 12, 2022

(65) Prior Publication Data
US 2022/0238446 A1    Jul. 28, 2022

Related U.S. Application Data

(63) Continuation of application No. 16/661,219, filed on Oct. 23, 2019, now Pat. No. 11,342,267.
(Continued)

(51) Int. Cl.
*H01L 23/538*    (2006.01)
*H01L 21/48*    (2006.01)
(Continued)

(52) U.S. Cl.
CPC ...... *H01L 23/5381* (2013.01); *H01L 21/4857* (2013.01); *H01L 21/561* (2013.01);
(Continued)

(58) Field of Classification Search
CPC ..... H01L 24/19; H01L 24/97; H01L 23/5389; H01L 23/585; H01L 25/50;
(Continued)

(56) References Cited

U.S. PATENT DOCUMENTS 6,936,500 B2    8/2005   Lindstedt
7,638,869 B2 *  12/2009  Irsigler ............... H01L 25/0657
                                            257/774
(Continued)

FOREIGN PATENT DOCUMENTS

CN    1577810 A    2/2005
CN    1971865 A    5/2007
(Continued)

OTHER PUBLICATIONS

Extended European Search Report and Written Opinion dated Jun. 9, 2020 for European Application No. 19210253.1.
(Continued)

*Primary Examiner* — Mohsen Ahmadi
(74) *Attorney, Agent, or Firm* — Winston Hsu

(57) ABSTRACT

A semiconductor package structure includes a first semiconductor die and a second semiconductor die neighboring the first semiconductor die. The first semiconductor die includes a first edge, a second edge opposite the first edge, and a first metal layer exposed from the second edge. The second semiconductor includes a third edge neighboring the second edge of the first semiconductor die, a fourth edge opposite the third edge, and a second metal layer exposed from the third edge. The first metal layer of the first semiconductor die is electrically connected to the second metal layer of the second semiconductor die.

11 Claims, 24 Drawing Sheets

Related U.S. Application Data

(60) Provisional application No. 62/770,861, filed on Nov. 23, 2018.

(51) Int. Cl.

| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 25/00* | (2006.01) |
| *H01L 25/065* | (2023.01) |

(52) U.S. Cl.
CPC ........ *H01L 21/568* (2013.01); *H01L 23/3128* (2013.01); *H01L 23/5383* (2013.01); *H01L 24/16* (2013.01); *H01L 25/0655* (2013.01); *H01L 25/50* (2013.01); *H01L 2224/16227* (2013.01)

(58) Field of Classification Search
CPC . H01L 25/0655; H01L 21/561; H01L 21/568; H01L 21/6835
See application file for complete search history.

(56) References Cited

U.S. PATENT DOCUMENTS

| | | | |
|---|---|---|---|
| 8,796,839 B1* | 8/2014 | Sutardja | H01L 25/0652 |
| | | | 257/532 |
| 9,935,071 B1 | 4/2018 | Lin et al. | |
| 9,941,253 B1* | 4/2018 | Jung | H01L 25/0652 |
| 2003/0193096 A1* | 10/2003 | Tao | H01L 23/055 |
| | | | 257/E23.19 |
| 2004/0227236 A1* | 11/2004 | Sawamoto | H01L 23/49822 |
| | | | 257/734 |
| 2008/0064142 A1* | 3/2008 | Gan | B81C 1/00301 |
| | | | 257/E21.705 |
| 2008/0315409 A1 | 12/2008 | Cordes et al. | |
| 2009/0321950 A1* | 12/2009 | Takiar | H01L 25/0657 |
| | | | 257/E23.024 |
| 2012/0187577 A1* | 7/2012 | Cordes | H01L 21/6835 |
| | | | 257/777 |
| 2015/0200162 A1* | 7/2015 | Constantino | H01L 23/49541 |
| | | | 257/532 |
| 2015/0214173 A1* | 7/2015 | Wen | H01L 24/17 |
| | | | 257/737 |
| 2018/0226314 A1* | 8/2018 | Chen | H01Q 19/10 |
| 2019/0139900 A1* | 5/2019 | Lee | H01L 23/544 |
| 2019/0371626 A2 | 12/2019 | Chew | |
| 2020/0006176 A1 | 1/2020 | Tsai et al. | |
| 2020/0168548 A1 | 5/2020 | Chang et al. | |

FOREIGN PATENT DOCUMENTS

| | | |
|---|---|---|
| CN | 105047652 A | 11/2015 |
| CN | 105206592 A | 12/2015 |
| CN | 108231606 A | 6/2018 |
| KR | 10-1147081 B1 | 5/2012 |

OTHER PUBLICATIONS

Chinese Office Action dated Mar. 29, 2021 for Chinese Application No. 201911120796.3.

* cited by examiner

SEMICONDUCTOR PACKAGE STRUCTURE AND METHOD FOR FORMING THE SAME

CROSS REFERENCE TO RELATED APPLICATIONS

This application is a Continuation of U.S. application Ser. No. 16/661,219, filed on Oct. 23, 2019, which claims the benefit of U.S. Provisional Application No. 62/770,861 filed on Nov. 23, 2018, the entirety entireties of which are incorporated by reference herein.

BACKGROUND

Technical Field

The disclosure relates to a semiconductor package, and more particularly to a semiconductor package that includes an inter-die connector.

Description of the Related Art

The semiconductor packaging process is an important step in the fabrication of electronic products. Semiconductor packages not only protect the semiconductor dies therein from outer environmental contaminants but also provide electrical connection paths between the electronic components inside and those outside of the semiconductor packages. For example, a semiconductor package contains wires that may be used to form conductive paths.

The semiconductor industry continues to improve the integration density of various electronic components (e.g. transistors, diodes, resistors, capacitors, and so on.) by continual reductions in minimum feature size, which allow more components to be integrated into a given area. These smaller electronic components also use a smaller package that utilizes less area or a smaller height, in some applications. When the semiconductor packages become denser, the crosstalk generated between conductive paths increases correspondingly.

While existing semiconductor package structures have been generally adequate for their intended purposes, they have not been satisfactory in all respects. There is a particular need for further improvements in the reduction of the crosstalk between electronic components.

SUMMARY

In one embodiment of the present disclosure, a semiconductor package structure is provided, wherein the semiconductor package structure includes a first semiconductor die and a second semiconductor die neighboring the first semiconductor die. The first semiconductor die includes a first edge, a second edge opposite the first edge, and a first metal layer exposed from the second edge. The second semiconductor includes a third edge neighboring the second edge of the first semiconductor die, a fourth edge opposite the third edge, and a second metal layer exposed from the third edge. The first metal layer of the first semiconductor die is electrically connected to the second metal layer of the second semiconductor die.

In one embodiment of the present disclosure, a method for forming a semiconductor package structure is provided, wherein the method for forming a semiconductor package structure includes providing a first semiconductor die on a carrier substrate, wherein the first semiconductor die includes a first edge, a second edge opposite the first edge, and a first metal layer exposed from the second edge, wherein the first metal layer is disposed in an interconnection layer of the first semiconductor die; and providing a second semiconductor die neighboring the first semiconductor die on the carrier substrate, wherein the second semiconductor die includes a third edge neighboring the second edge of the first semiconductor die, a fourth edge opposite the third edge, and a second metal layer exposed from the third edge, wherein the second metal layer is disposed in an interconnection layer of the second semiconductor die; and forming an electrical connection between the first metal layer of the first semiconductor die and the second metal layer of the second semiconductor die.

A detailed description is given in the following embodiments with reference to the accompanying drawings.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
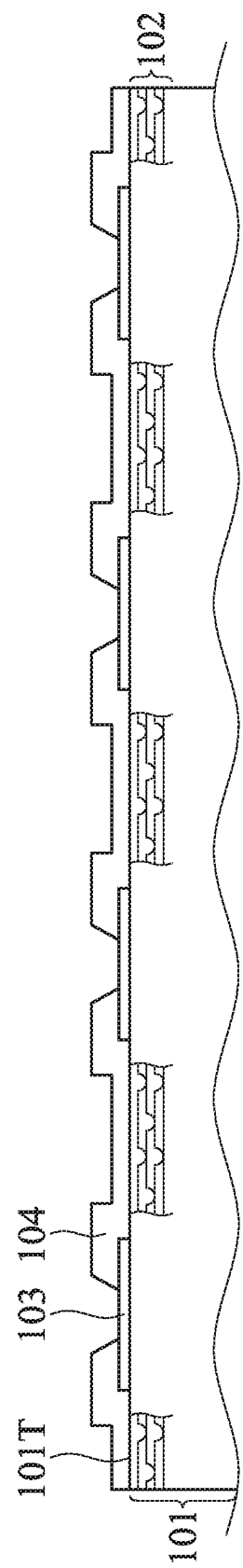
FIGS. 1-8 are cross-sectional views illustrating various steps in the process of manufacturing a semiconductor package structure, according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with operations performed in a particular order, these operations may be performed in another logical order. Additional features can be provided to the semiconductor structures in embodiments of the present disclosure. Some of the features described below can be replaced or eliminated for different embodiments.

Embodiments of the present disclosure provide a semiconductor package structure which includes an inter-die connector to form an electrical connection between two adjacent dies. The inter-die connector is disposed between two adjacent dies to make an electrical connection between the metal layers respectively exposed from edges of the two adjacent die. By setting the inter-die connector, the grounding lines of the two adjacent dies can be electrically connected directly through the inter-die connector without through additional redistribution layers, such that the conductive path between the two adjacent dies can be effectively reduced, thereby reducing the crosstalk and parasitic inductance between the additional redistribution layers in the semiconductor package structure with high integration density.

Figure 6:
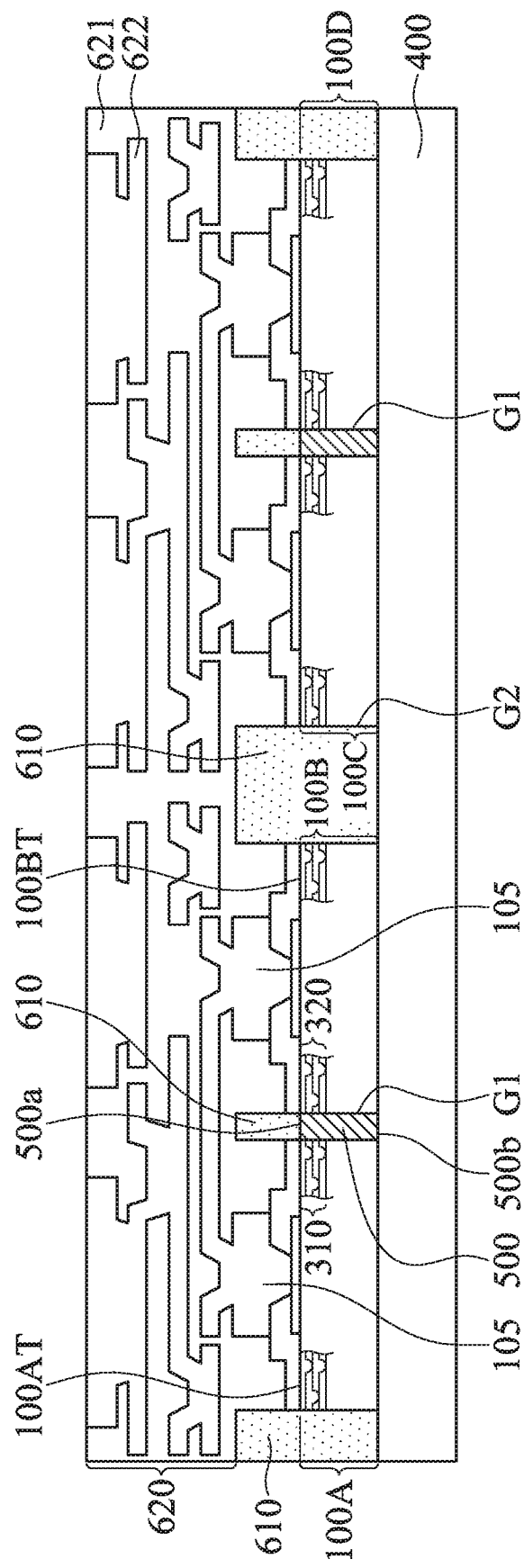
Figure 7:
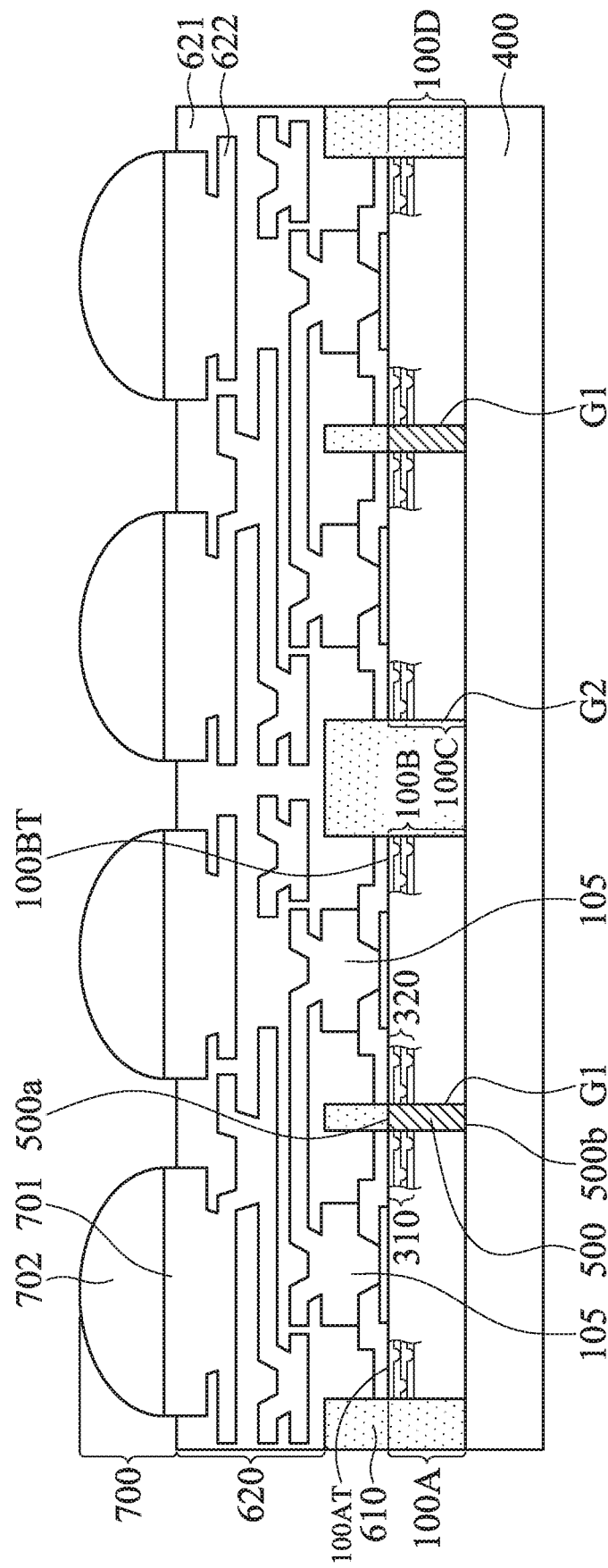
Figure 8:
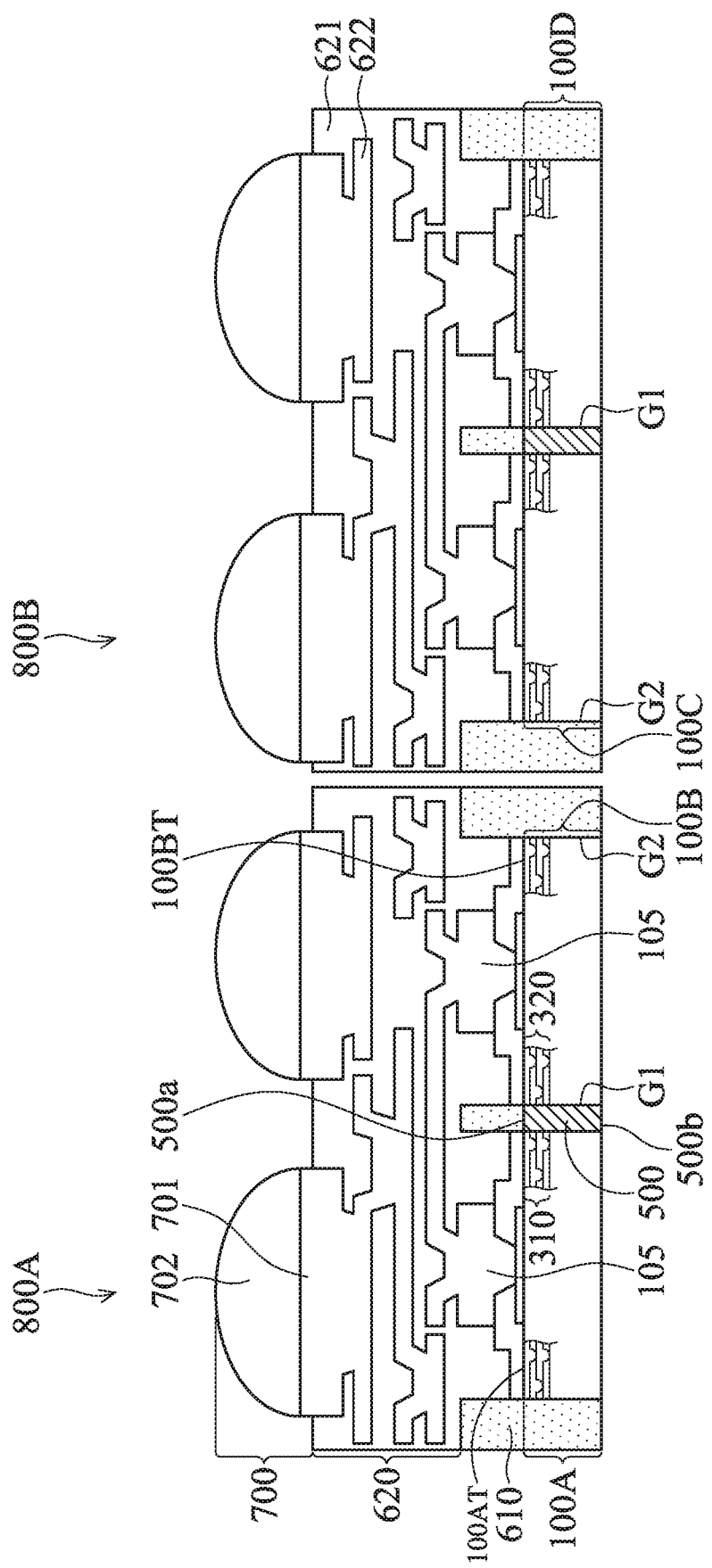

FIGS. 1-7 are cross-sectional views illustrating various steps in the process of manufacturing a semiconductor package structure 800A (as shown in FIG. 8), according to some embodiments of the present disclosure. Referring to FIG. 1, a wafer 101 with various devices (not shown) fabricated thereon is provided. The various devices (or components) on the wafer 101 are electrically connected to each other by an interconnection layer 102 to form functional circuit. As shown in FIG. 1, the interconnection layer 102 is embedded in inter-metal dielectric (IMD) layers (not shown) and disposed closely adjacent to a top surface 101T of the wafer 101. A plurality of conductive pads 103 and a passivation layer 104 are sequentially formed on the front side 101T of the wafer 101, wherein each of the conductive pads 103 is partially exposed from the passivation layer 104.

In some embodiments, the wafer 101 may include integrated circuits, such as logic integrated circuits, analog integrated circuits, mixed signal integrated circuits, power integrated circuits, or memory circuits; micro-electro mechanical systems (MEMS); opto-electronic devices; sensors, such as light sensors or fingerprint sensor; or the like. In some embodiments, the wafer 101 includes an active element (not shown) formed therein, such as a transistor, a metal oxide semiconductor field effect transistor (MOSFET), a metal insulator semiconductor FET (MISFET), a junction field effect transistor (FET), an insulated gate bipolar transistor (IGBT), a combination thereof, or the like. It should be noted that FIG. 1 does not illustrate the components of the wafer 101 under the interconnection layer 102 for the purpose of simplicity and clarity.

In some embodiments, the interconnection layer 102 may include contact plugs formed in an interlayer dielectric (ILD) layer and/or vias and metal lines formed in inter-metal dielectric (IMD) layers (not shown), wherein a portion of the interconnection layer 102 may serve as a seal-ring structure to prevent mechanical damage to the semiconductor dies during the dicing process and prevent the invasion of moisture and chemical contaminants. For example, the interconnection layer 102 may be formed by a single damascene process or a dual damascene process.

Figure 2:
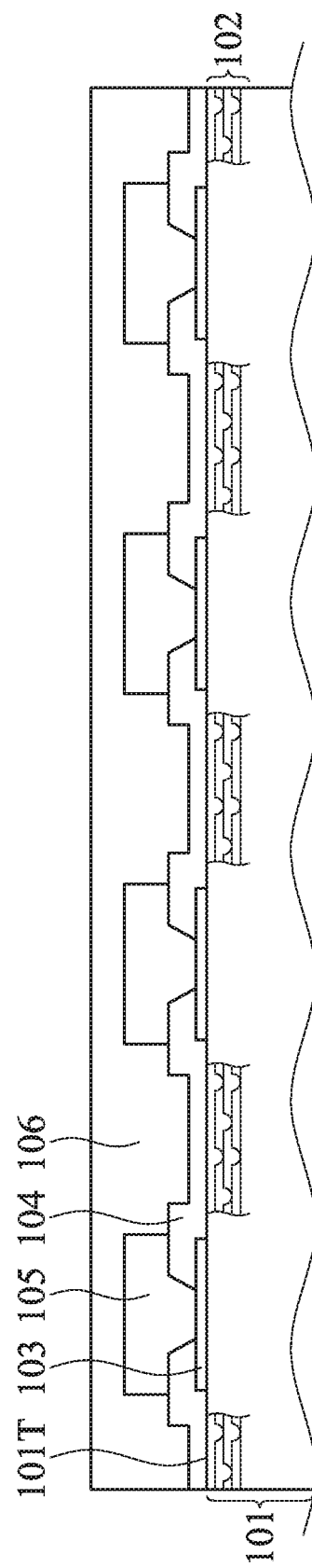

Referring to FIG. 2, in some embodiments, a plurality of bumps 105 are correspondingly formed on top surfaces of the plurality of conductive pads 103 exposed from the passivation layer 104, and an insulating layer 106 (e.g. a polyimide layer) is formed to cover the plurality of bumps 105 and the passivation layer 104. In some embodiments, the passivation layer 104 may include $SiO_2$, $SiN_3$, SiON, $Al_2O_3$, AlN, polyimide (PI), benzocyclobutene (BCB), polybenzoxazole (PBO), other suitable materials, or a combination thereof. In some embodiments, the passivation layer 104 may be formed by chemical vapor deposition (CVD), spin-coating, other suitable methods, or a combination thereof. In some embodiments, the bumps 105 are copper pillars which are used to form an electrical connection between the active elements (not shown) in the wafer 101 and a redistribution layer (e.g. a redistribution layer 620 shown in FIG. 6) to be electrically coupled with external circuits.

Figure 3:
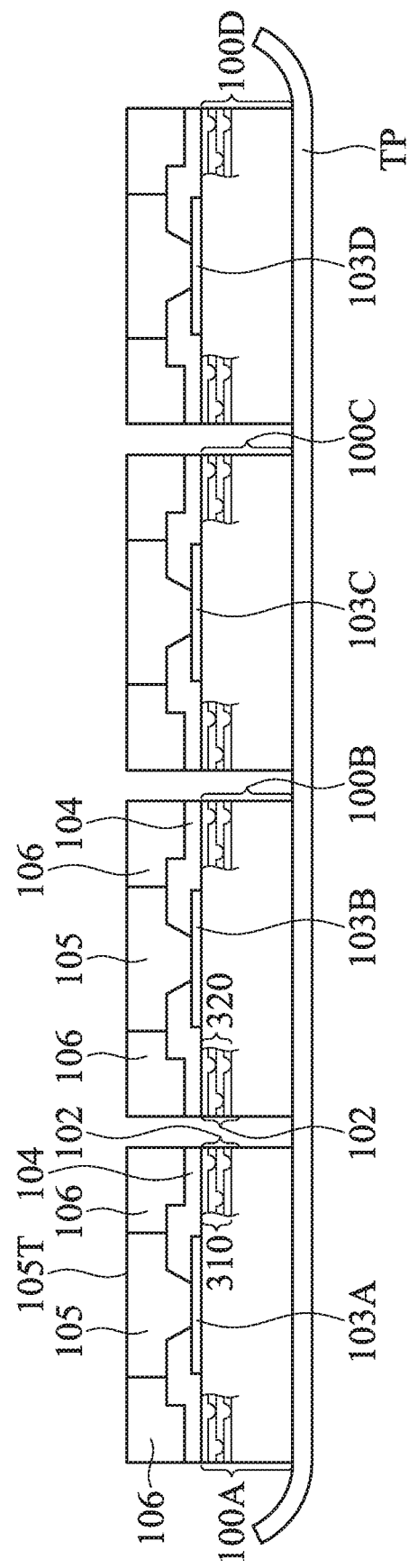

Referring to FIG. 3, a planarization process, such as a chemical mechanical polish (CMP) process or other suitable planarization processes, is performed to the insulating layer 106 to expose the top surfaces 105T of the plurality of bumps 105, and a dicing process is performed after the planarization process to divide the wafer 101 into a plurality of individual semiconductor dies (e.g. semiconductor dies 100A/100B/100C/100D). As shown in FIG. 3, after the dicing process, the semiconductor dies 100A/100B/100C/100D are disposed with intervals on a dicing tape TP with the interconnection layer 102 exposed from the die edges. More specifically, a metal layer 310 in the interconnection layer 102 of the semiconductor die 100A and a metal layer 320 in the interconnection layer 102 of the semiconductor die 100B are exposed to the gap between the semiconductor die 100A and the semiconductor die 100B. In some embodiments, the metal layer 310 and the metal layer 320 may serve as a seal-ring structure to prevent mechanical damage to the semiconductor dies during the dicing process.

In some embodiments, the metal layers 310 and 320 may include Cu, W, Ag, Sn, Ni, Co, Cr, Ti, Pb, Au, Bi, Sb, Zn, Zr, Mg, In, Te, Ga, other suitable metal materials, an alloy thereof, or a combination thereof. In some embodiments, metal layers may be deposited by a process such as a physical vapor deposition (PVD) process, plating, an atomic layer deposition (ALD) process, other suitable processes, or a combination thereof.

Figure 4:
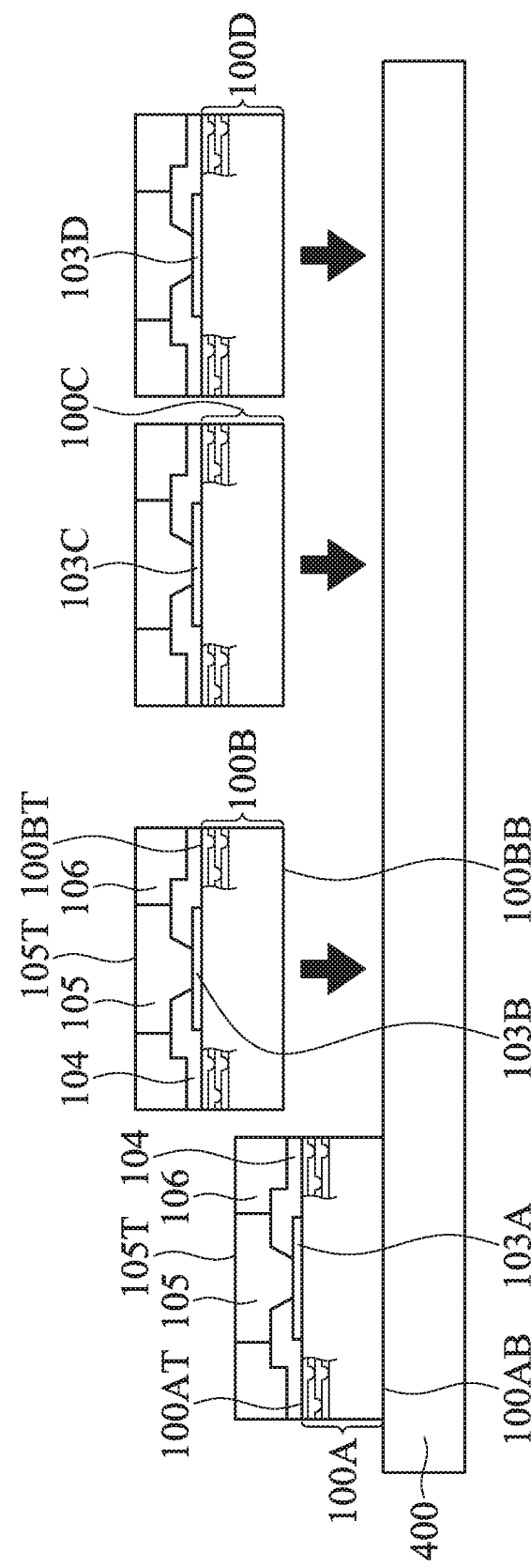

Subsequently, referring to FIG. 4, the plurality of semiconductor dies (e.g. semiconductor dies 100A/100B/100C/100D) with the conductive pads 103, the passivation layer 104, the bumps 105, and the insulating layer 106 formed on front sides of the semiconductor dies are picked from the dicing tape TP and placed on a carrier substrate 400. For example, the front sides of the semiconductor dies may be a front side 100AT of the semiconductor die 100A, a front side 100BT of the semiconductor die 100B, and so on. Specifically, back sides of the semiconductor dies, such as the back side 100AB of the semiconductor die 100A and the back side 100BB of the semiconductor die 100B, are attached to a top surface of the carrier substrate 400.

Figure 5:
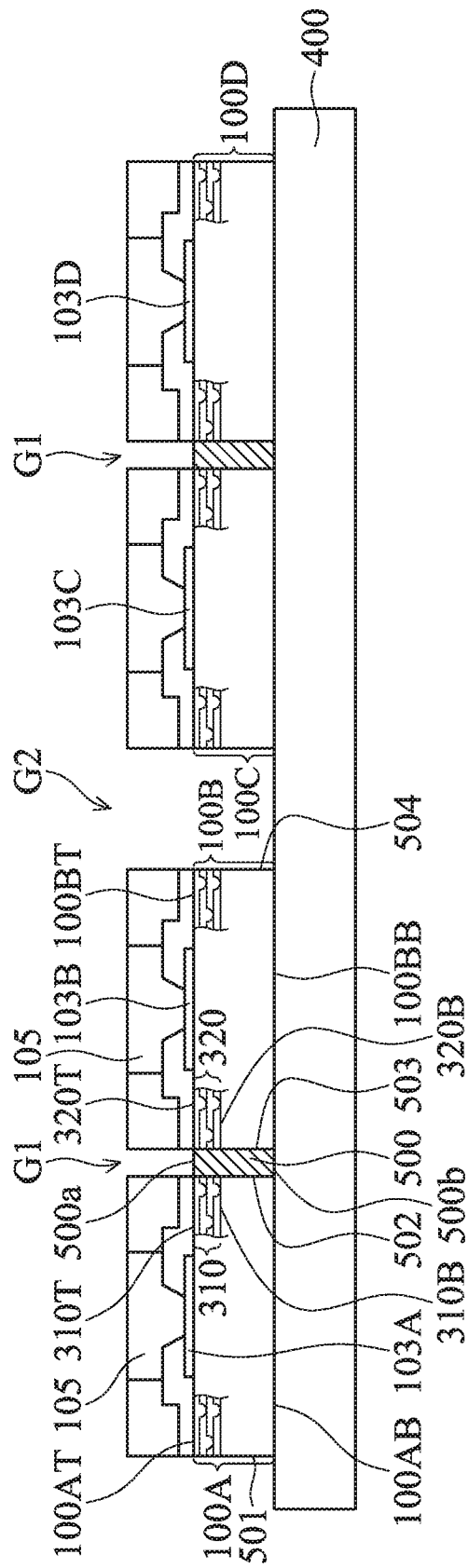

Referring to FIG. 5, in some embodiments, the semiconductor die 100A and the semiconductor die 100B which will be combined into the semiconductor package structure 800A later (as shown in FIG. 8) are disposed on the carrier substrate 400 with a first gap G1 therebetween, the semiconductor die 100C and the semiconductor die 100D which will be combined into the semiconductor package structure 800B later (as shown in FIG. 8) are also disposed on the carrier substrate 400 with a first gap G1 therebetween. Meanwhile, the semiconductor die 100B and the semiconductor die 100C, which will not be combined into the same package structure, are disposed with a second gap G2 therebetween greater than the first gap G1. The second gap G2 may be regarded as "an inter-package gap". For example, the width of the first gap G1 may be in a range from about 10 micrometers to about 1000 micrometer, and the width of the second gap G2 may be in a range from about 10 micrometers to about 1000 micrometer, wherein a subsequent dicing process (as shown in FIG. 8) may be performed through the second gap G2. Furthermore, the difference between the width of the first gap G1 and the width of the second gap G2 may be in a range from about 10 micrometers to about 1000 micrometer.

Still referring to FIG. 5, the semiconductor die 100A includes a first edge 501 and a second edge 502 opposite the first edge 501, wherein the metal layer 310 is exposed from the second edge 502 to the first gap G1 between the semiconductor die 100A and the semiconductor die 100B. The semiconductor die 100B includes a third edge 503 neighboring the second edge 502 of the semiconductor die 100A and a fourth edge 504 opposite the third edge 503, wherein the metal layer 320 is exposed from the third edge 503 to the first gap G1 between the semiconductor die 100A and the semiconductor die 100B. In some embodiments, the conductive pad 103A and the metal layer 310 are disposed on opposite sides of the front side 100AT of the semiconductor die 100A, and the conductive pad 103B and the metal layer 320 are disposed on opposite sides of the front side 100BT of the semiconductor die 100B.

According to some embodiments of the present disclosure, as shown in FIG. 5, an inter-die connector 500 is formed between the metal layer 310 of the semiconductor die 100A and the metal layer 320 of the semiconductor die 100B to provide their electrical connection. The inter-die connector 500 includes a first surface 500a adjacent to the front side 100AT of the semiconductor die 100A and the front side 100BT of the semiconductor die 100B and a second surface 500b away from the front side 100AT of the semiconductor die 100A and front side 100BT of the semiconductor die 100B.

In some embodiments, the material of the inter-die connector 500 may include metal (e.g. tungsten, aluminum, or copper), metal alloy, other suitable conductive materials, or a combination thereof. For example, the conductive materials may be deposited in the first gap G1 by a process such as a physical vapor deposition (PVD) process, electroplating, electroless plating, metal organic chemical-vapor deposition (MOCVD), an atomic layer deposition (ALD) process, other suitable processes, or a combination thereof.

Specifically, according to some embodiments of the present disclosure, the inter-die connector 500 is made of copper and is formed by a plating process. For example, the plating process for forming the inter-die connector 500 may include a sputtering process to blanketly form a metallic seed layer (not shown) on the carrier substrate 400, a photolithography process to form a patterned photoresist (not shown) with an opening corresponding to the first gap G1, an electro-plating process by connecting the previously formed seed layer to an electrode (not shown) to plate copper in the first gap G1 through the opening of the patterned photoresist, and removing the patterned photoresist and the seed layer which is covered by the patterned photoresist. In other embodiments, the inter-die connector 500 may be formed by applying metal paste in the first gap G1 to form the electrical connection between the metal layers 310 and 320. The material of the metal paste may include metal (e.g. tungsten, aluminum, or copper), metal alloy, other suitable conductive materials, or a combination thereof. For example, as shown in the cross-sectional view illustrating in FIG. 5, the aspect ratio of the inter-die connector 500 may be in a range from about 10 micrometers to about 1000 micrometers, for example, about 200 micrometers.

Still referring to FIG. 5, in some embodiments, the inter-die connector 500 partially fills the first gap G1, wherein the first surface 500a of the inter-die connector 500 is substantially level with a top surface 310T of the metal layer 310 and a top surface 320T of the metal layer 320, and the second surface 500b of the inter-die connector 500 is lower than a bottom surface 310B of the metal layer 310 and a bottom surface 320B of the metal layer 320. Specifically, the second surface 500b of the inter-die connector 500 may be coplanar with the back side 100AB of the semiconductor die 100A and the back side 100BB of the semiconductor die 100B. In other words, the second surface 500b of the inter-die connector 500 abuts the top surface of the carrier substrate 400 that supports the semiconductor dies (e.g. semiconductor dies 100A/100B/100C/100D).

Referring to FIG. 6, a molding compound layer 610 is formed to encapsulate the semiconductor dies (e.g. the semiconductor dies 100A/100B/100C/100D) after the formation of the inter-die connector 500. The molding compound layer 610 fills the first gap G1 not filled by the inter-die connector 500 and fills the second gap G2 (inter-package gap) between the semiconductor die 100B and the semiconductor die 100C. Thus, the first surface 500a of the inter-die connector 500 is in contact with the molding compound layer 610. After the formation of the molding compound layer 610, a redistribution layer 620 is formed on the molding compound layer 610 and electrically connected to the semiconductor die 100A and the semiconductor die 100B respectively by the plurality of bumps 105 (e.g. the copper pillars) (which are disposed on the front side 100AT of the semiconductor die 100A and the front side 100BT of the semiconductor die 100B). A portion of the molding compound layer 610 is disposed between the redistribution layer 620 and the first surface 500a of the inter-die connector 500.

For example, the molding compound layer 610 may be formed of a resin, a moldable polymer, or the like. The molding compound layer 610 may be a resin (e.g. an epoxy resin) which is applied while substantially liquid and then may be cured to transform in the solid. In other embodiments, the molding compound layer 610 may be an ultra-violet (UV) or thermally cured polymer applied as a gel or malleable solid capable of being disposed around the semiconductor dies (e.g. the semiconductor dies 100A/100B/100C/100D), and then may be cured through a UV or thermal curing process. The molding compound layer 610 may be cured with a mold (not shown).

In some embodiments, the redistribution layer 620 includes one or more conductive traces 622 disposed in an inter-metal dielectric (IMD) layer 621. For example, at least one of the conductive traces 622 is electrically coupled to the semiconductor die 100A, and at least one of the conductive traces 622 is electrically coupled to the semiconductor die 100B. For example, the inter-metal dielectric layer 621 may be a single layer or a multi-layer structure. Moreover, the inter-metal dielectric layer 621 may be formed of organic materials, which include a polymer base material, non-organic materials, which include silicon nitride ($SiN_x$), silicon oxide ($SiO_x$), graphene, or the like. In some embodiments, the inter-metal dielectric layer 621 is a low-k dielectric layer (k is the dielectric constant of the dielectric layer). In other embodiments, the inter-metal dielectric layer 621 may be formed of a photo sensitive material, which includes a dry film photoresist, or a taping film.

For example, the conductive traces 622 may include aluminum, copper, gold, platinum, nickel, tin, a combination thereof, a conductive polymer material, a conductive ceramic material (such as indium tin oxide or indium zinc oxide), or another suitable conductive material. In some embodiments, the conductive traces 622 may be formed by a deposition process, such as a physical vapor deposition (PVD) process, electroplating, electroless plating, metal organic chemical-vapor deposition (MOCVD), an atomic layer deposition (ALD) process, other suitable processes, or a combination thereof.

Referring to FIG. 7, a plurality of conductive structures 700 are formed on the redistribution layer 620 by a ball placement process, a screen printing process, an electroplating process, or other suitable processes, and followed by a reflow process. In some embodiments, the conductive structures 700 may be solder balls, conductive bumps, conductive pillars, or other suitable conductive structures. Specifically, according to some embodiments of the present disclosure, the conductive structures 700 are solder balls, wherein each of the solder balls includes a first conductive material 701 and a second conductive material 702 formed on the first conductive material 701. The material of the first conductive material 701 is different from the material of the second conductive material 702. For example, the materials of the first conductive material 701 and the second conductive material 702 may be selected from tin, lead, copper, gold, nickel, a combination thereof, or another suitable conductive material. More specifically, in some embodiments, the first conductive material 701 is copper and covered by the second conductive material 702 which is tin to be advantageous to a subsequent soldering process.

Referring to FIG. 8, the carrier substrate 400 is removed and a dicing process is performed with a dicing saw tape (not shown) to form individual semiconductor package structures 800A/800B by cutting through the redistribution layer 620 and a portion of the molding compound layer 610 which fills the second gap G2. As shown in FIG. 8, the semiconductor package structure 800A includes the semiconductor die 100A and the semiconductor die 100B, and the semiconductor package structure 800B includes the semiconductor die 100C and the semiconductor die 100D. According to some embodiments of the present disclosure, the semiconductor die 100A and the semiconductor die 100B may have the same functionalities. In other embodiments, the semiconductor die 100A and the semiconductor die 100B may have different functionalities.

Figure 23:
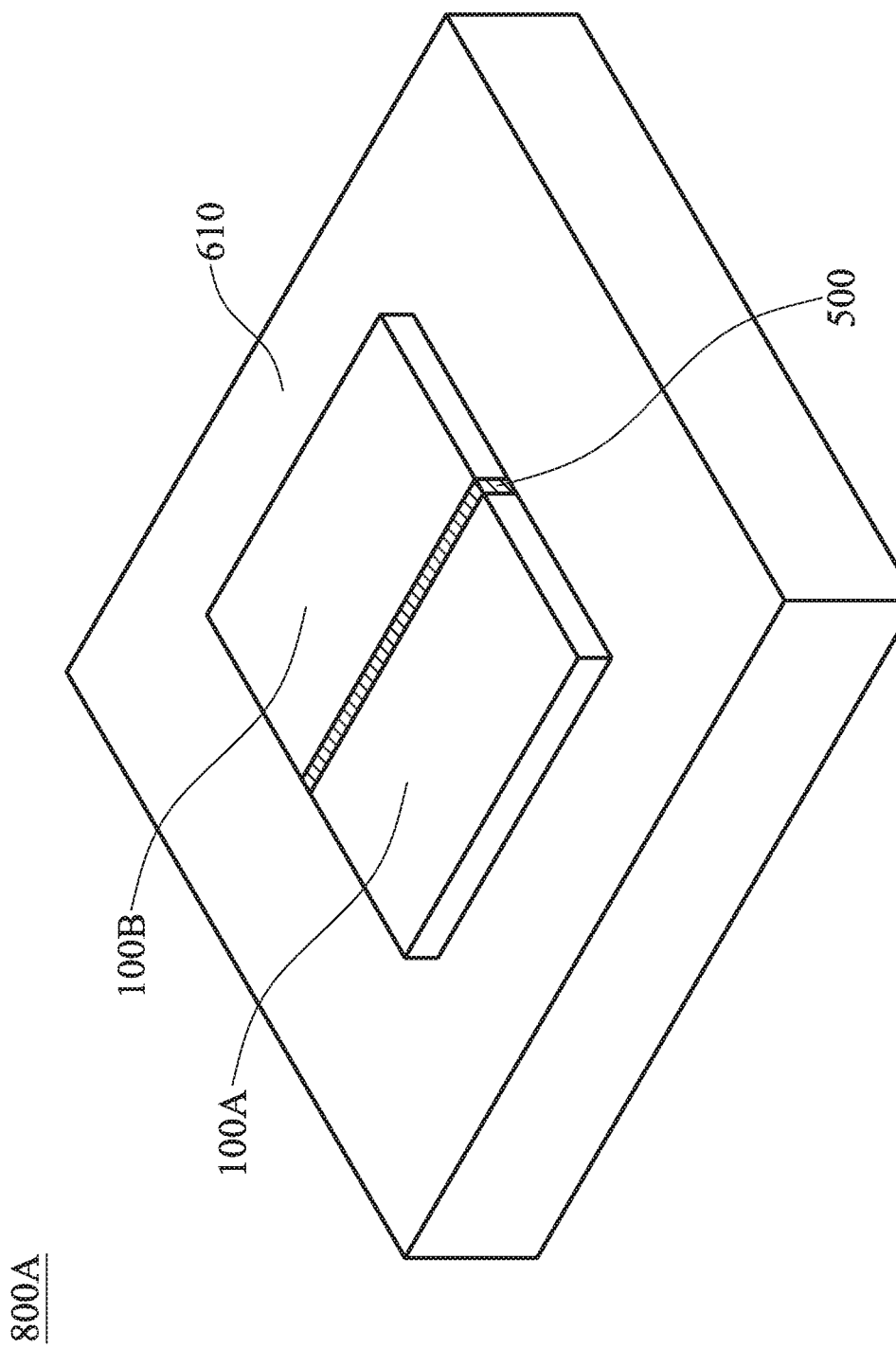
FIG. 23 is a perspective view illustrating an exemplary semiconductor package structure, according to some embodiments of the present disclosure.

Referring to FIG. 8 along with FIG. 23. FIG. 23 is a perspective view illustrating the semiconductor package structure 800A, according to some embodiments of the present disclosure. It should be noted that FIG. 23 does not illustrate all of the elements of the semiconductor package structure 800A for the purpose of simplicity and clarity. In such embodiments, the semiconductor die 100A and the semiconductor die 100B which is in the electrical connection with the semiconductor die 100A by the inter-die connector 500 included in the semiconductor package structure 800A are homogeneous dies which may have the same functionalities.

Figure 24:
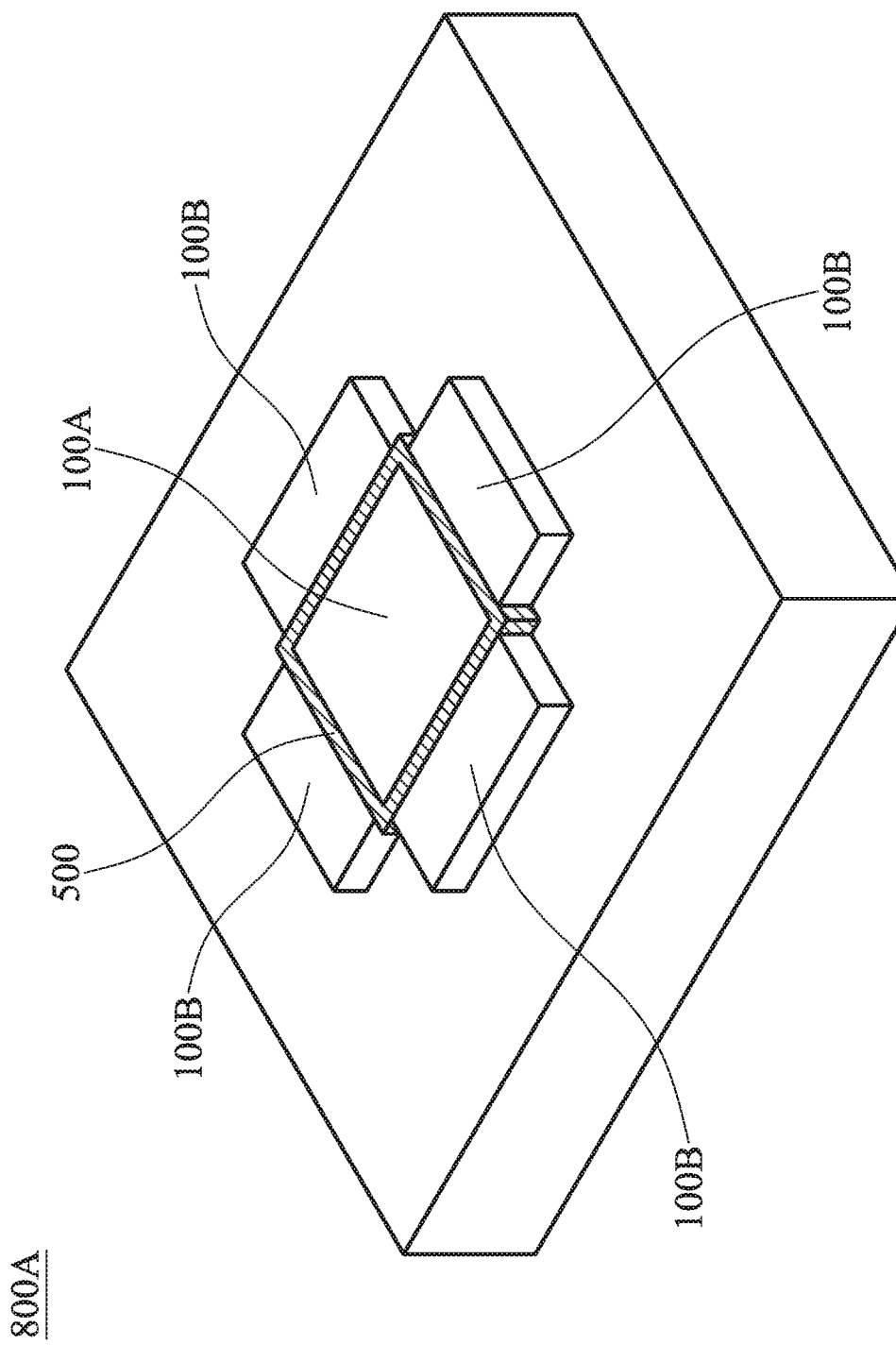
FIG. 24 is a perspective view illustrating an exemplary semiconductor package structure, according to other embodiments of the present disclosure.

On the other hand, referring to FIG. 8 along with FIG. 24. FIG. 24 is a perspective view illustrating the semiconductor package structure 800A, according to other embodiments of the present disclosure. It should be noted that FIG. 24 also does not illustrate all of the elements of the semiconductor package structure 800A for the purpose of simplicity and clarity. In such embodiments, the semiconductor die 100A and the semiconductor dies 100B which are in the electrical connection with each other included in the semiconductor package structure 800A are heterogeneous dies which may have different functionalities. As shown in FIG. 24, the four edges of the semiconductor die 100A are surrounded by the inter-die connector 500 to form electrical connections with the semiconductor dies 100B disposed adjacent to the four edges of the semiconductor die 100A. Furthermore, the four semiconductor dies 100B disposed around the semiconductor die 100A may have or may not have the same functionality. It should be noted that the arrangement of the semiconductor dies and the inter-die connector disposed therebetween may vary depending on the product design, and the embodiments of the present disclosure are not limited thereto.

As described above, according to the embodiments of the present disclosure, by the arrangement of the inter-die connector to form an electrical connection between two adjacent dies, the grounding lines of the two adjacent dies can be electrically connected directly through the inter-die connector without through additional redistribution layers, such that the conductive path between the two adjacent dies can be effectively reduced, thereby reducing the crosstalk and parasitic inductance between the additional redistribution layers in the semiconductor package structure with high integration density.

Figure 9:
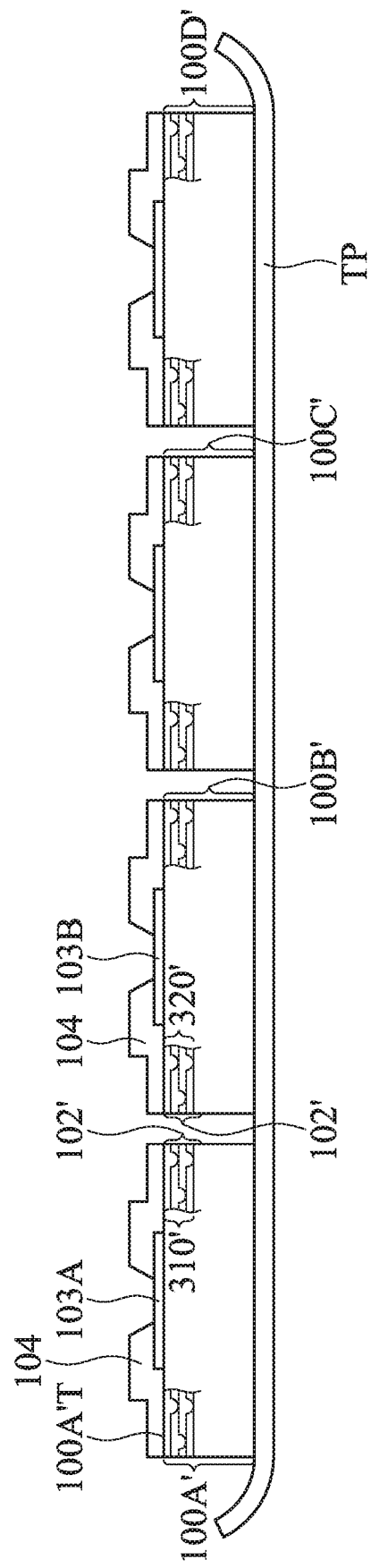
FIGS. 9-15 are cross-sectional views illustrating various steps in the process of manufacturing a semiconductor package structure, according to other embodiments of the present disclosure.

FIGS. 9-15 are cross-sectional views illustrating various steps in the process of manufacturing a semiconductor package structure 800A' according to other embodiments of the present disclosure. Specifically, the embodiments provided in FIGS. 9-15 are with respect to a semiconductor package type which is different from the semiconductor package type provided in the embodiments in FIGS. 1-8. According to some embodiments of the present disclosure, the semiconductor package type provided in FIGS. 1-8 includes a redistribution layer electrically coupled to conductive pads of semiconductor dies through copper pillars, and the semiconductor package type provided in FIGS. 9-15 includes a redistribution layer directly electrically coupled to conductive pads of semiconductor dies without through copper pillars. Referring to FIG. 9, the structure may be formed sequentially after the step illustrated in FIG. 1. According to some embodiments of the present disclosure, the structure illustrated in FIG. 9 is similar to the structure illustrated in FIG. 3, except that none of the plurality of bumps 105 and the insulating layer 106 is formed on the plurality of conductive pads 103 and the passivation layer 104 in the structure illustrated in FIG. 9. Thus, the details are not repeated for brevity.

Figure 10:
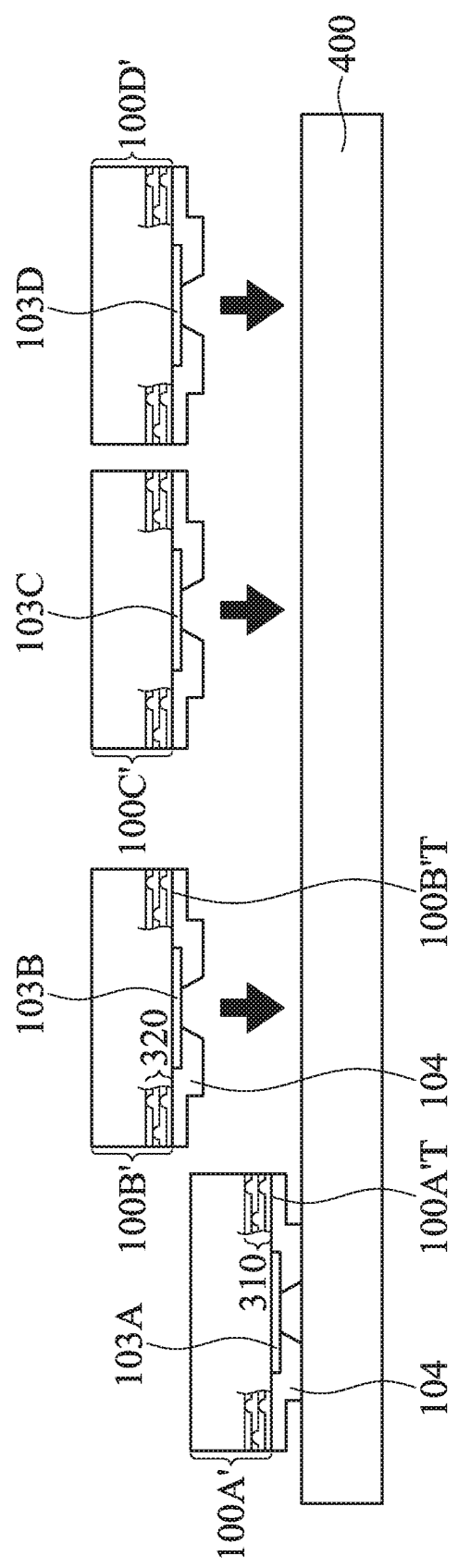

Referring to FIG. 10, the plurality of semiconductor dies (e.g. semiconductor dies 100A'/100B'/100C'/100D') with the conductive pads 103 (e.g. the conductive pads 103A/103B/103C/103D) and the passivation layer 104 formed on front sides of the semiconductor dies are picked from the dicing tape TP and flipped upside down to place on a carrier substrate 400. For example, the front sides of the semiconductor dies may be a front side 100A'T of the semiconductor die 100A', a front side 100B'T of the semiconductor die 100B', and so on. Specifically, the passivation layer 104 formed on the front sides of the semiconductor dies are attached to a top surface of the carrier substrate 400.

Figure 11:
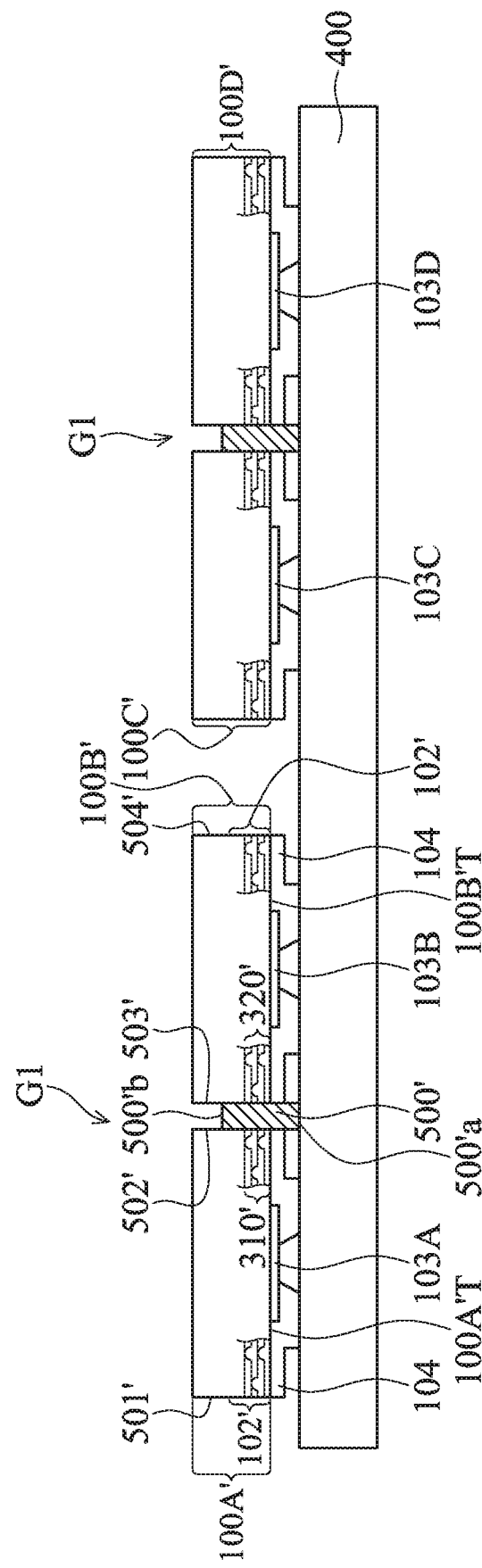
Figure 15:
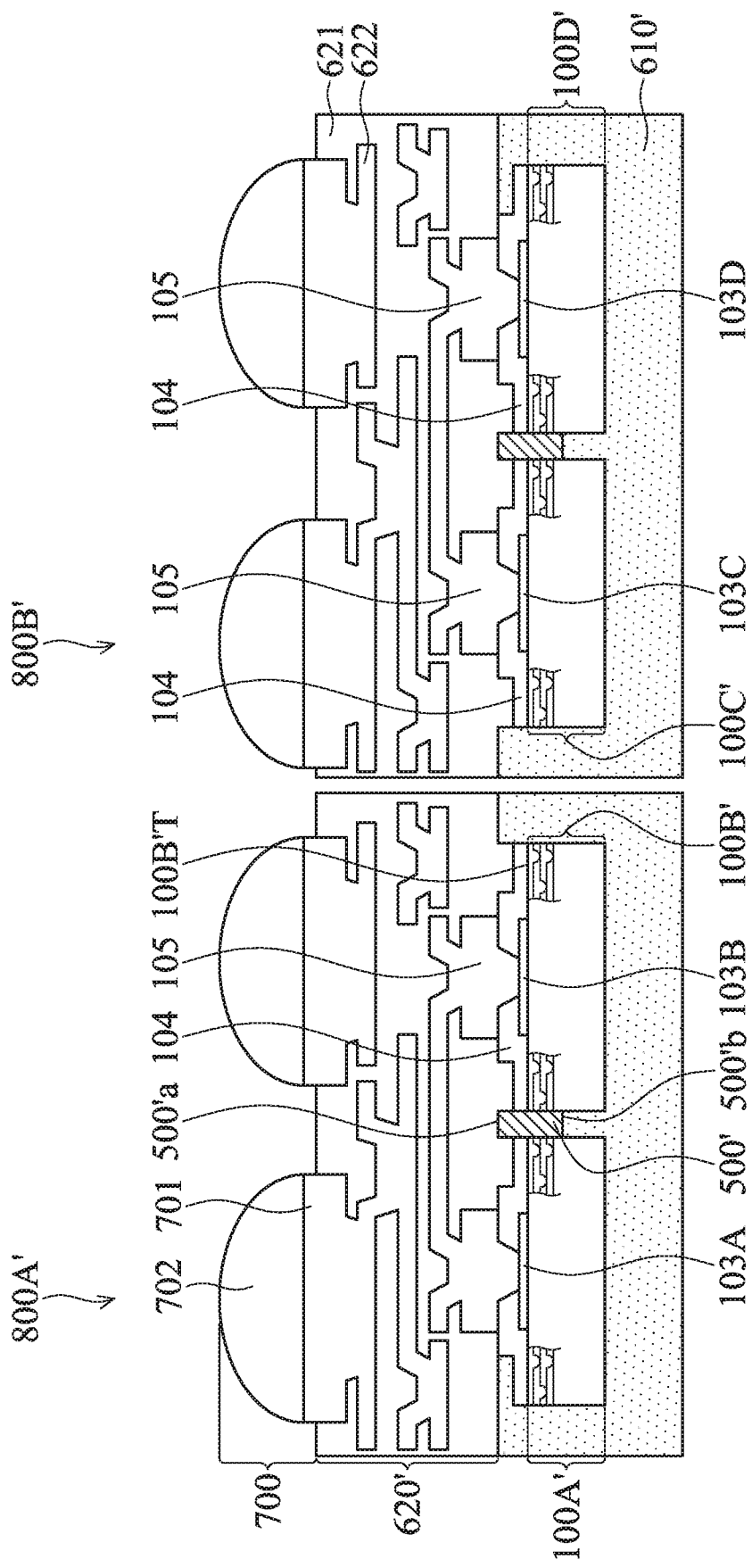

Referring to FIG. 11, in some embodiments, the semiconductor die 100A' and the semiconductor die 100B' which will be combined into the semiconductor package structure 800A' later are disposed on the carrier substrate 400 with a first gap G1 therebetween, the semiconductor die 100C' and the semiconductor die 100D' which will be combined into the semiconductor package structure 800B' later are also disposed on the carrier substrate 400 with a first gap G1 therebetween, and there is a second gap G2 larger than first gap G1 remaining between the semiconductor die 100B' and the semiconductor die 100C'. In some embodiments, a subsequent dicing process (as shown in FIG. 15) may be performed through the second gap G2.

Still referring to FIG. 11, the semiconductor die 100A' includes a first edge 501' and a second edge 502' opposite the first edge 501', wherein the metal layer 310' in the interconnection layer 102' is exposed from the second edge 502' to the first gap G1 between the semiconductor die 100A' and the semiconductor die 100B'. The semiconductor die 100B' includes a third edge 503' neighboring the second edge 502' of the semiconductor die 100A' and a fourth edge 504' opposite the third edge 503', wherein the metal layer 320' in the interconnection layer 102' is exposed from the third edge 503' to the first gap G1 between the semiconductor die 100A' and the semiconductor die 100B'. In some embodiments, the conductive pad 103A and the metal layer 310' are disposed on opposite sides of the front side 100A'T of the semiconductor die 100A', and the conductive pad 103B and the metal layer 320' are disposed on opposite sides of the front side 100B'T of the semiconductor die 100B'. In some embodiments, the metal layer 310' and the metal layer 320' may serve as a seal-ring structure to prevent mechanical damage to the semiconductor dies during the dicing process and prevent the invasion of moisture and chemical contaminants.

According to some embodiments of the present disclosure, as shown in FIG. 11, an inter-die connector 500' is formed between the metal layer 310' of the semiconductor die 100A' and the metal layer 320' of the semiconductor die 100B' to form the electrical connection, wherein the inter-die connector 500' includes a first surface 500'a adjacent to the front side 100A'T of the semiconductor die 100A' and the front side 100B'T of the semiconductor die 100B' and a second surface 500'b away from the front side 100A'T of the semiconductor die 100A', the front side 100B'T of the semiconductor die 100B', and the top surface of the carrier substrate 400. The inter-die connector 500' partially fills the first gap G1 between the semiconductor die 100A' and the semiconductor die 100B'. In some embodiments, the first surface 500'a of the inter-die connector 500' protrudes beyond the front side 100A'T of the semiconductor die 100A' and the front side 100B'T of the semiconductor die 100B'. The material and method for forming the inter-die connector 500' may be selected from those of the above-mentioned inter-die connector 500. The details are not repeated for brevity.

Figure 12:
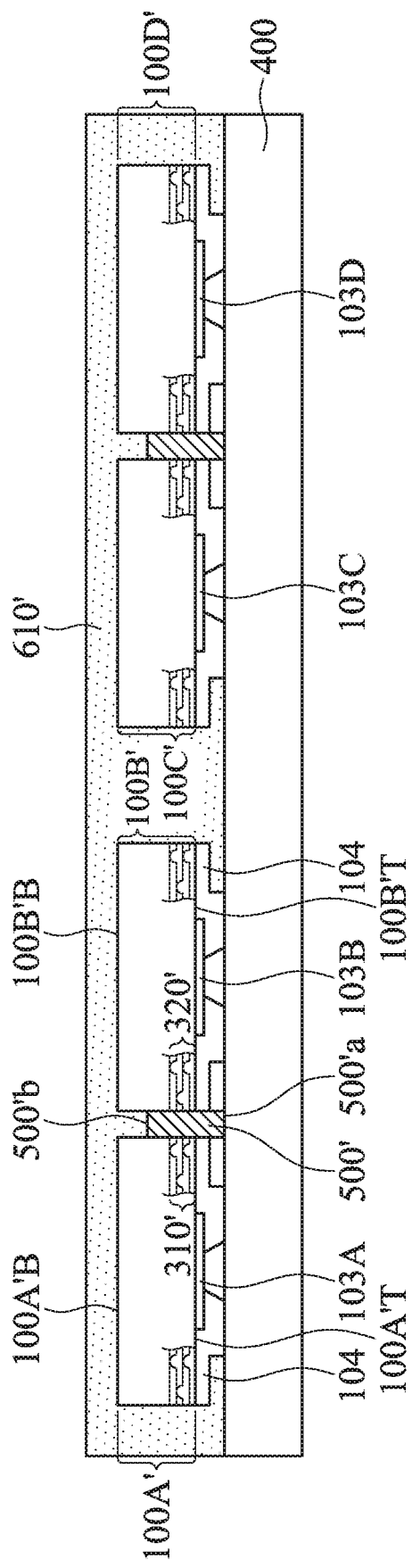

Referring to FIG. 12, a molding compound layer 610' is formed to encapsulate the semiconductor dies (e.g. the semiconductor dies 100A'/100B'/100C'/100D') after the formation of the inter-die connector 500', wherein the second surface 500'b of the inter-die connector 500' is in contact with the molding compound layer 610'. Specifically, the molding compound layer 610' encapsulates the sidewall surfaces and the back side 100A'B of the semiconductor die 100A' and the sidewall surface and the back side 100B'B of the semiconductor die 100B'. The molding compound layer 610' fills the first gap G1 not filled by the inter-die connector 500' and is in contact with the second surface 500'b of the inter-die connector 500'.

Figure 13:
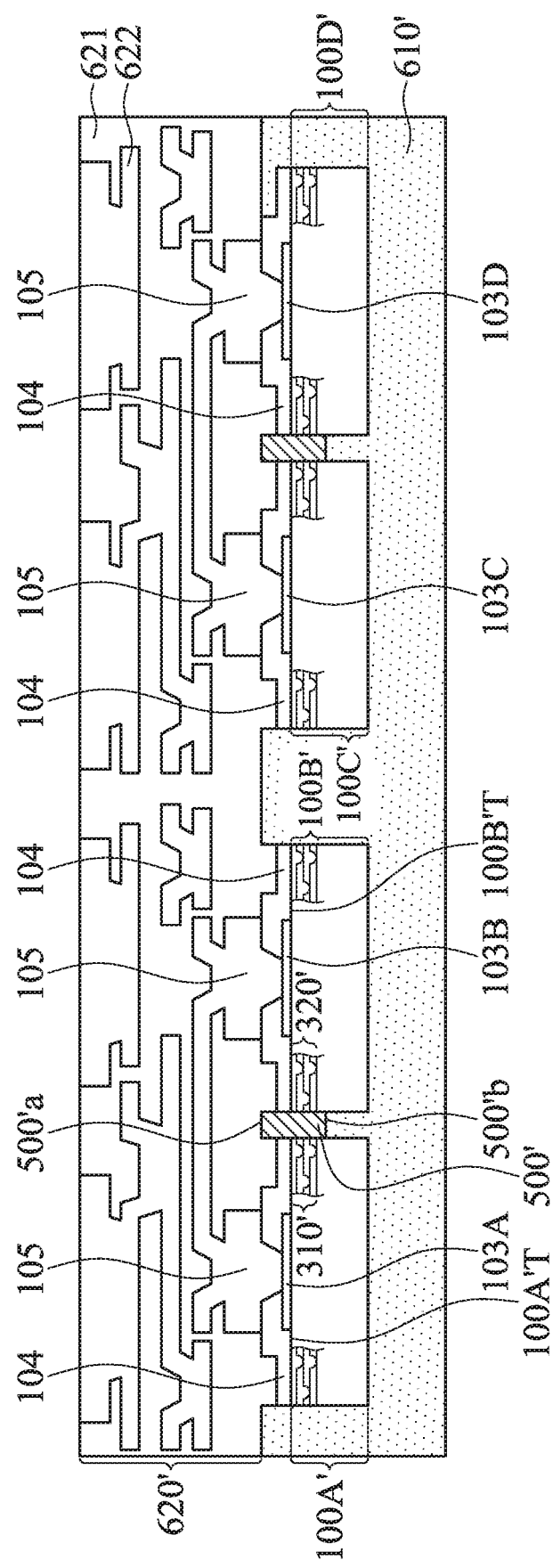

Referring to FIG. 13, the structure illustrated in FIG. 12 is flipped upside down, and the carrier substrate 400 is removed to form a redistribution layer 620' over the front side 100A'T of the semiconductor die 100A' and the front side 100B'T of the semiconductor die 100B'. According to some embodiments of the present disclosure, the redistribution layer 620' is respectively electrically coupled to the semiconductor dies (e.g. the semiconductor dies 100A'/100B'/100C'/100D') through the plurality of conductive pads 103 (e.g. the conductive pads 103A/103B/103C/103D) formed on the front sides of the semiconductor dies.

It should be noted that the material and method for forming the molding compound layer 610' and the redistribution layer 620' respectively may be selected from those of the above-mentioned molding compound layer 610 and redistribution layer 620. The details are not repeated for brevity.

Figure 14:
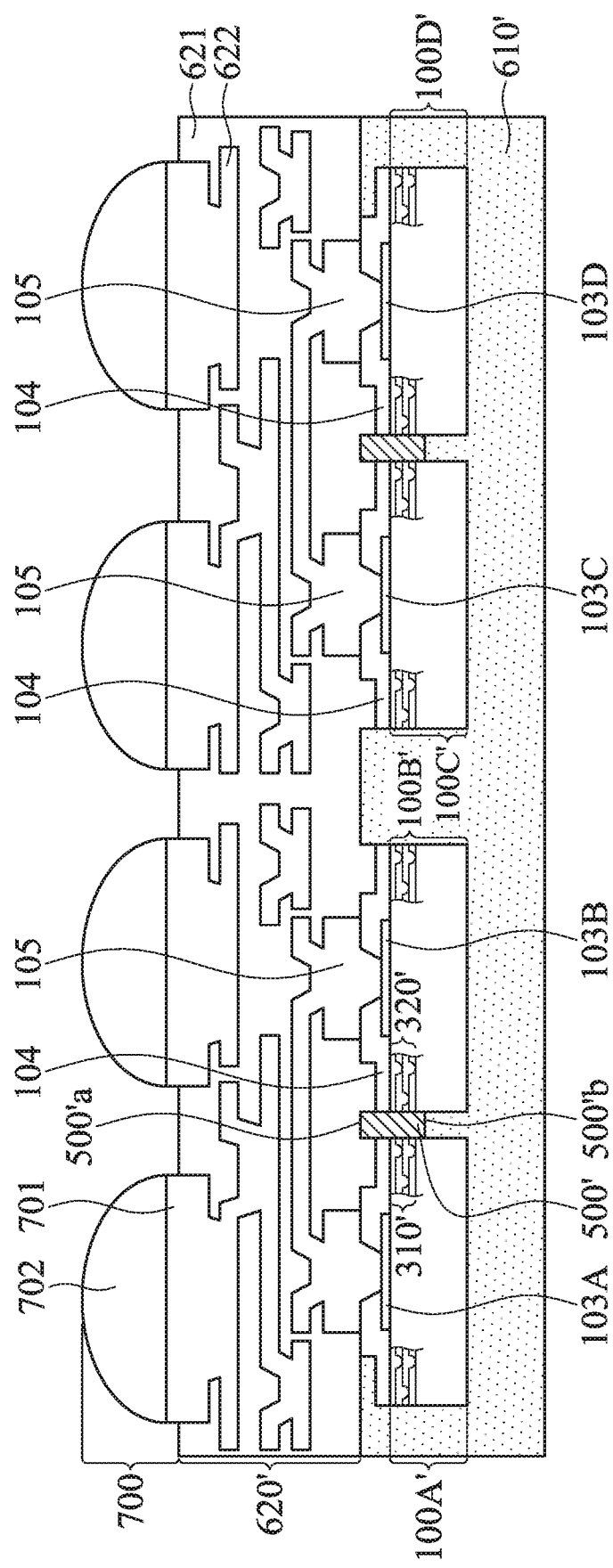

Referring to FIG. 14, a plurality of conductive structures 700 are formed on the redistribution layer 620' by a ball placement process, a screen printing process, an electroplating process, or other suitable processes, and followed by a reflow process. In some embodiments, the conductive structures 700 may be solder balls, conductive bumps, conductive pillars, or other suitable conductive structures. It should be noted that the material of the plurality of conductive structures 700 may be selected from that of the above-mentioned conductive structures 700. The details are not repeated for brevity.

Referring to FIG. 15, a dicing process is performed to form individual semiconductor package structures 800A'/800B' by cutting through the redistribution layer 620' and a portion of the molding compound layer 610' which fills the second gap G2. As shown in FIG. 15, the semiconductor package structure 800A' includes the semiconductor die 100A' and the semiconductor die 100B', and the semiconductor package structure 800B' includes the semiconductor die 100C' and the semiconductor die 100D'. According to some embodiments of the present disclosure, the semiconductor die 100A' and the semiconductor die 100B' may have the same functionalities (as discussed with respect to FIG. 25). In other embodiments, the semiconductor die 100A' and the semiconductor die 100B' may have different functionalities (as discussed with respect to FIG. 26).

As described above, the arrangement of the inter-die connector is also applicable to the embodiments provided in FIGS. 9-15 of the present disclosure. By the arrangement of the inter-die connector to form an electrical connection between two adjacent dies, the grounding lines of the two adjacent dies can be electrically connected directly through the inter-die connector without through additional redistribution layers, such that the conductive path between the two adjacent dies can be effectively reduced, thereby reducing the crosstalk and parasitic inductance between the additional redistribution layers in the semiconductor package structure with high integration density.

FIGS. 16-22 are cross-sectional views illustrating various steps in the process of manufacturing a semiconductor package structure 800A" according to other embodiments of the present disclosure. Specifically, the embodiments provided in FIGS. 16-22 are with respect to a semiconductor package type which is different from the semiconductor package type provided in the embodiments in FIGS. 1-8 and the semiconductor package type provided in the embodiments in FIGS. 9-15. According to some embodiments of the present disclosure, the semiconductor package type provided in FIGS. 1-8 includes a redistribution layer electrically coupled to conductive pads of semiconductor dies through copper pillars, the semiconductor package type provided in FIGS. 9-15 includes a redistribution layer directly electrically coupled to conductive pads of semiconductor dies, and the semiconductor package type provided in FIGS. 16-22 includes a redistribution layer electrically coupled to conductive pads of semiconductor dies through micro-bumps.

Figure 16:
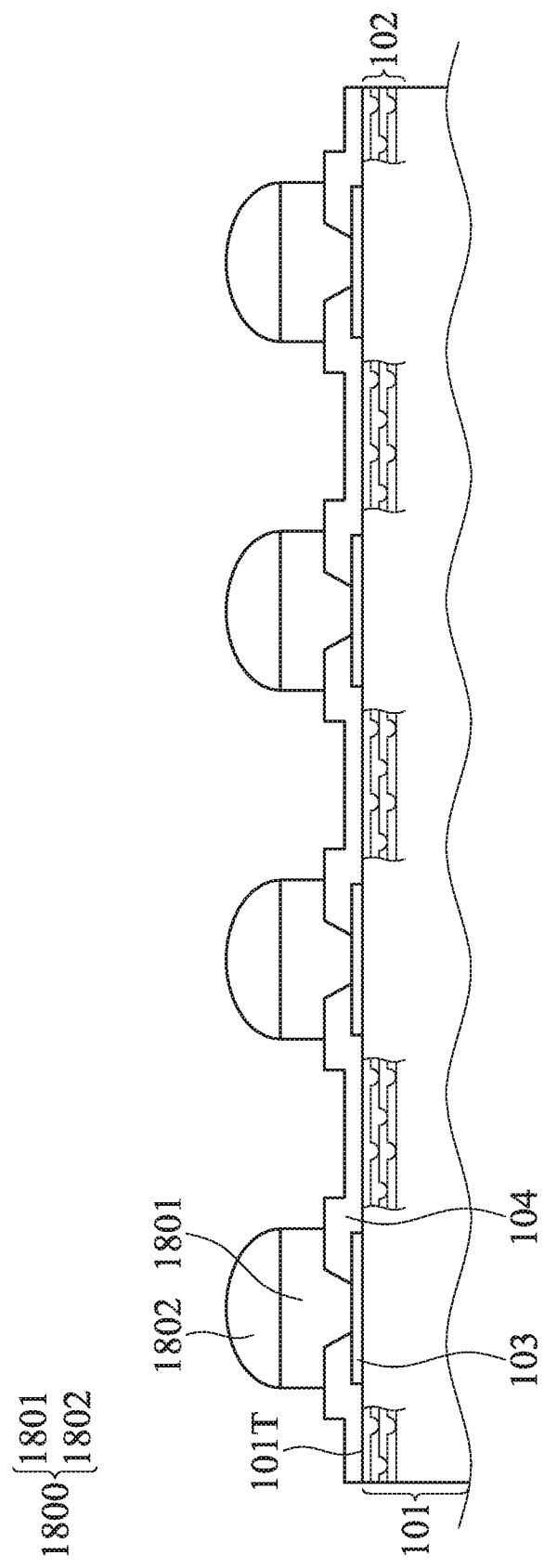
FIGS. 16-22 are cross-sectional views illustrating various steps in the process of manufacturing a semiconductor package structure, according to other embodiments of the present disclosure.

Referring to FIG. 16, the structure may be formed sequentially after the step illustrated in FIG. 1. As shown in FIG. 16, a plurality of bumps 1800 are respectively formed on top surfaces of the plurality of conductive pads 103 exposed from the passivation layer 104. In some embodiments, the bumps 1800 are micro-bumps which are used to form an electrical connection between the active elements in the wafer 101 and a redistribution layer (e.g. a redistribution layer 620" shown in FIG. 18) to be electrically coupled with external circuits. In such embodiments, each of the bumps 1800 includes a first conductive material 1801 and a second conductive material 1802 formed on the first conductive material 1801. The material of the first conductive material 1801 is different from the material of the second conductive material 1802. For example, the materials of the first conductive material 1801 and the second conductive material 1802 may be selected from tin, lead, copper, gold, nickel, a combination thereof, or another suitable conductive material.

Figure 17:
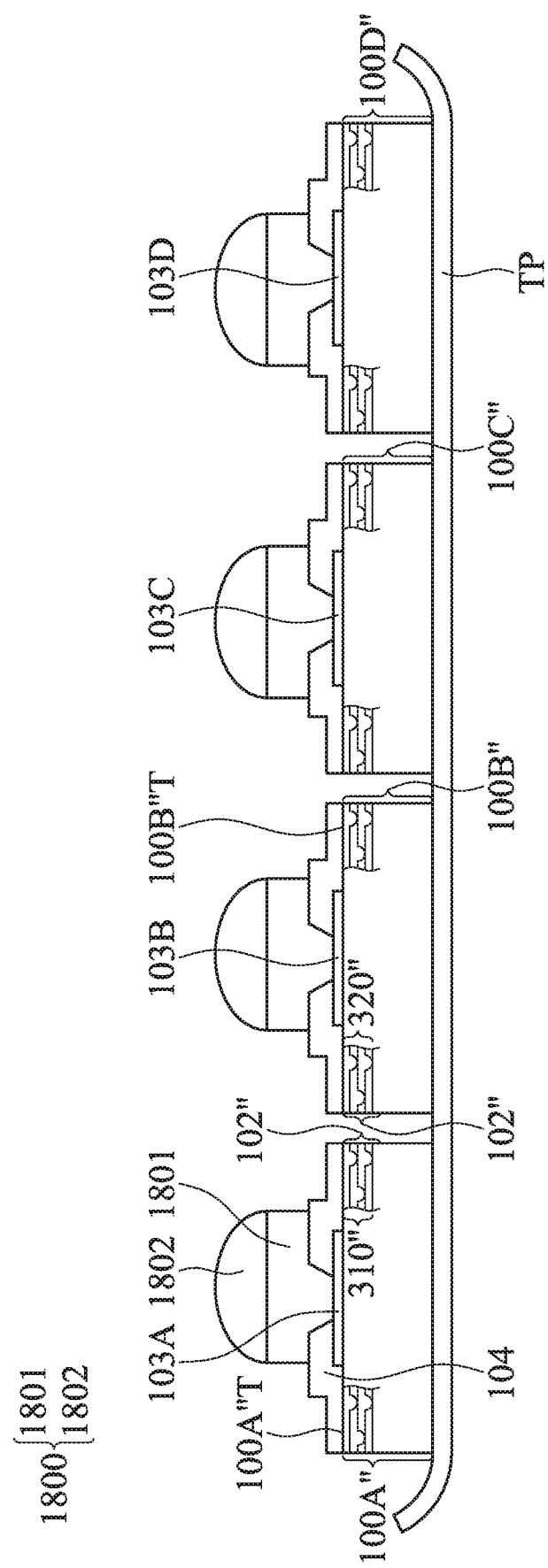

Referring to FIG. 17, a dicing process is performed to divide the wafer 101 into a plurality of semiconductor dies (e.g. semiconductor dies 100A"/100B"/100C"/100D"). As shown in FIG. 17, after the dicing process, the semiconductor dies 100A"/100B"/100C"/100D" are disposed with intervals on a dicing tape TP, wherein a metal layer 310" in the interconnection layer 102" of the semiconductor die 100A" and a metal layer 320" in the interconnection layer 102" of the semiconductor die 100B" are exposed to the gap between the semiconductor die 100A" and the semiconductor die 100B".

Figure 18:
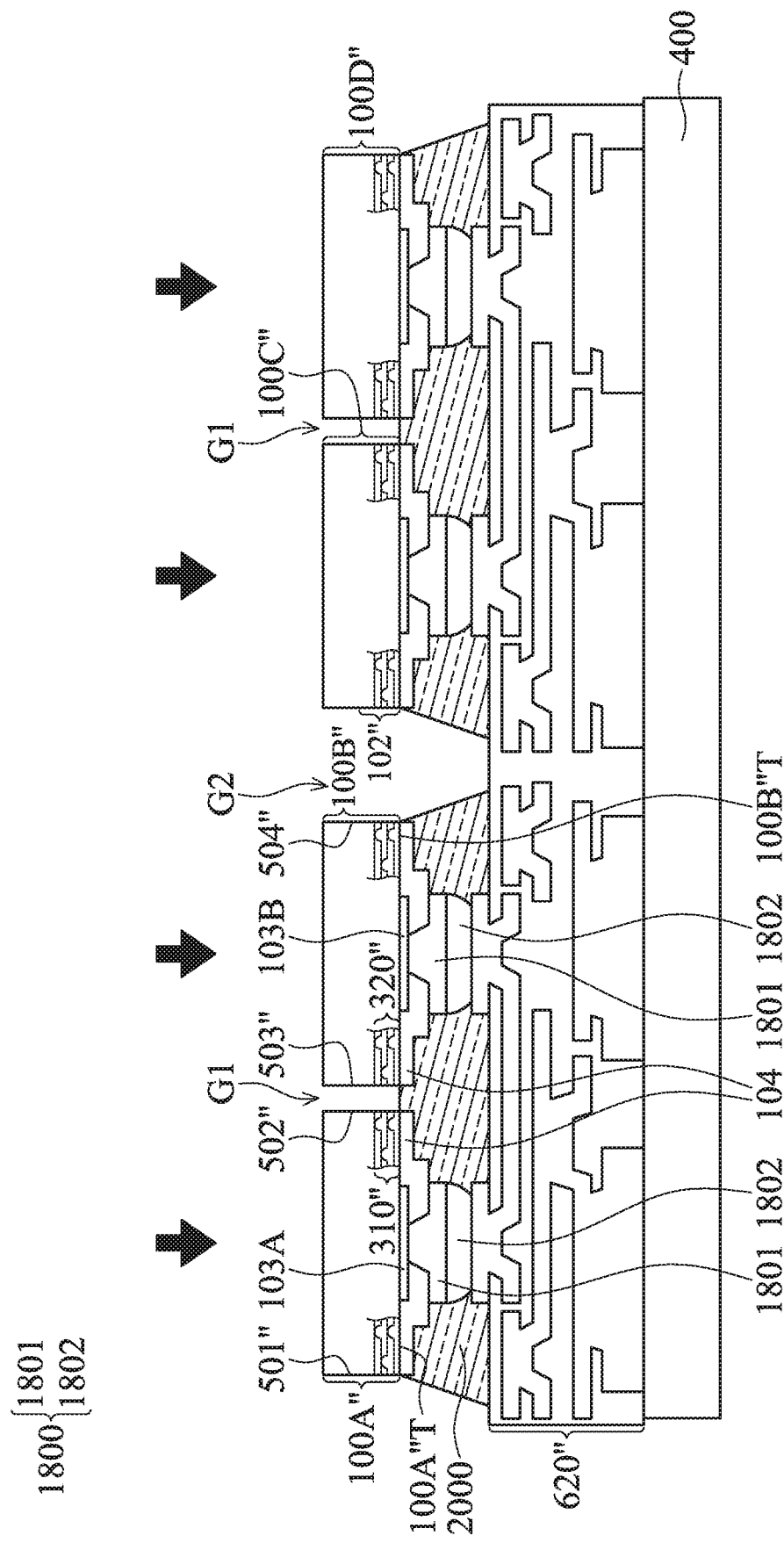

Referring to FIG. 18, the plurality of semiconductor dies (e.g. semiconductor dies 100A"/100B"/100C"/100D") with the conductive pads 103 (e.g. conductive pads 103A/103B/103C/103D), the passivation layer 104, and bumps 1800 formed on front sides of the semiconductor dies are picked from the dicing tape TP and flipped upside down to place on a redistribution layer 620" provided on a carrier substrate 400. For example, the front sides of the semiconductor dies may be a front side 100A"T of the semiconductor die 100A", a front side 100B"T of the semiconductor die 100B", and so on. Specifically, the plurality of first bumps 1800 on the front sides of the semiconductor dies are bonded to the redistribution layer 620" on the carrier substrate 400.

Figure 22:
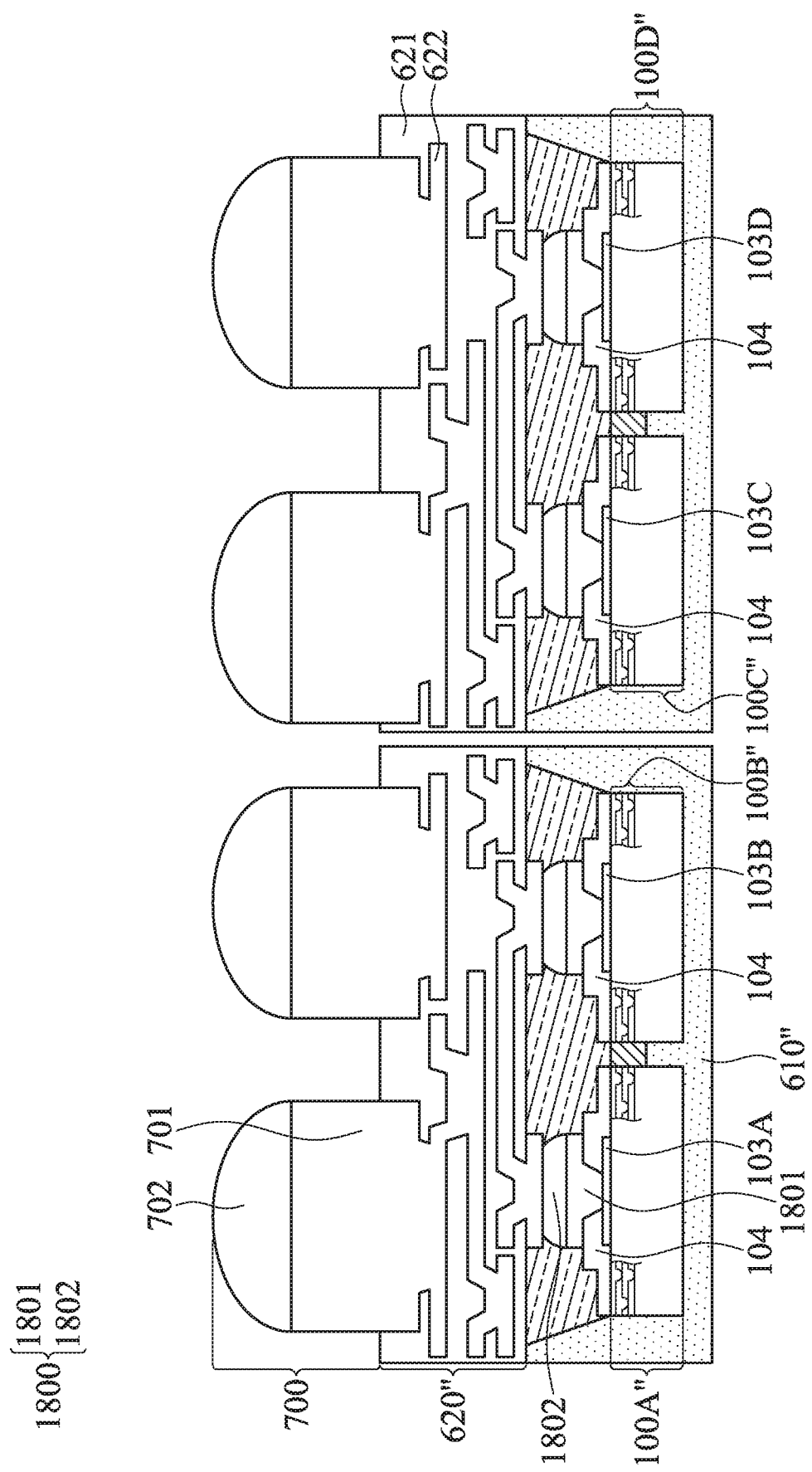

As shown in FIG. 18, in some embodiments, the semiconductor die 100A" and the semiconductor die 100B" which will be combined into the semiconductor package structure 800A" later are disposed on the carrier substrate 400 with a first gap G1 therebetween, the semiconductor die 100C" and the semiconductor die 100D" which will be combined into the semiconductor package structure 800B" later are also disposed on the carrier substrate 400 with a first gap G1 therebetween, and there is a second gap G2 larger than first gap G1 remaining between the semiconductor die 100B" and the semiconductor die 100C". In some embodiments, a subsequent dicing process (as shown in FIG. 22) may be performed through the second gap G2.

Still referring to FIG. 18, the semiconductor die 100A" includes a first edge 501" and a second edge 502" opposite the first edge 501", wherein the metal layer 310" in the interconnection layer 102" is exposed from the second edge 502" to the first gap G1 between the semiconductor die 100A" and the semiconductor die 100B". The semiconductor die 100B" includes a third edge 503" neighboring the second edge 502" of the semiconductor die 100A" and a fourth edge 504" opposite the third edge 503", wherein the metal layer 320" in the interconnection layer 102" is exposed from the third edge 503" to the first gap G1 between the semiconductor die 100A" and the semiconductor die 100B". In some embodiments, the conductive pad 103A and the metal layer 310" are disposed on opposite sides of the front side 100A"T of the semiconductor die 100A", and the conductive pad 103B and the metal layer 320" are disposed on opposite sides of the front side 100B"T of the semiconductor die 100B". In some embodiments, the metal layer 310" and the metal layer 320" may serve as a seal-ring structure to prevent mechanical damage to the semiconductor dies during the dicing process and prevent the invasion of moisture and chemical contaminants.

Still referring to FIG. 18, after boding the semiconductor dies 100A"/100B"/100C"/100D" on the redistribution layer 620", an underfill material 2000 is formed to surround the plurality of bumps 1800. In some embodiments, the underfill material 2000 is made of or includes a polymer material. The underfill material 2000 may include an epoxy-based resin. In some embodiments, the formation of the underfill material 2000 includes a dispensing process, an application process, other applicable processes, or a combination thereof. In some embodiments, a thermal curing process is used during the formation of the underfill material 2000.

Figure 19:
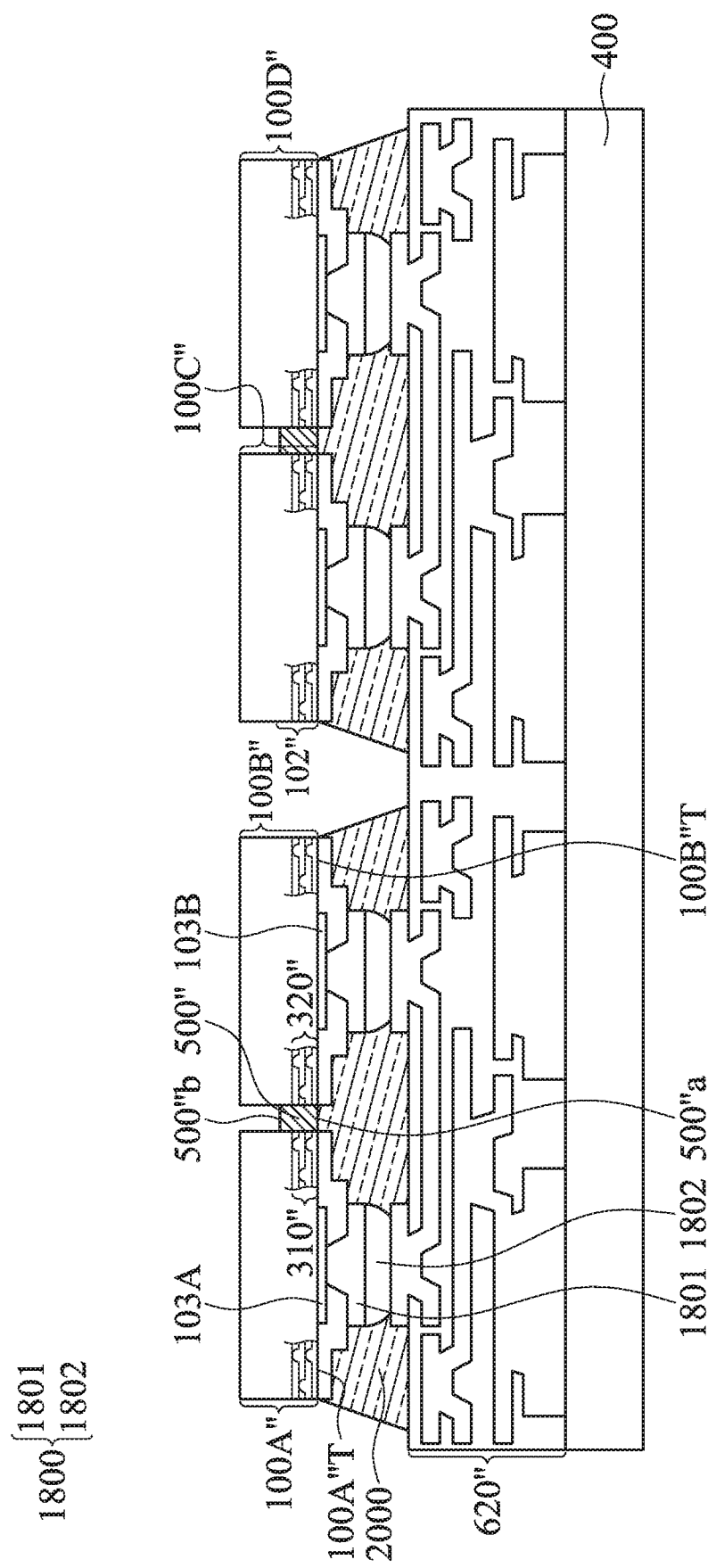

Referring to FIG. 19, according to some embodiments of the present disclosure, an inter-die connector 500" is formed between the metal layer 310" of the semiconductor die 100A" and the metal layer 320" of the semiconductor die 100B" to form the electrical connection, wherein the inter-die connector 500" includes a first surface 500"a adjacent to the front side 100A"T of the semiconductor die 100A" and the front side 100B"T of the semiconductor die 100B" and a second surface 500"b away from the front side 100A"T of the semiconductor die 100A" and front side 100B"T of the semiconductor die 100B". In some embodiments, the inter-die connector 500" is formed on the underfill material 2000, wherein the first surface 500"a of the inter-die connector 500" is in contact with the underfill material 2000. The material and method for forming the inter-die connector 500" may be selected from those of the above-mentioned inter-die connector 500. The details are not repeated for brevity.

Figure 20:
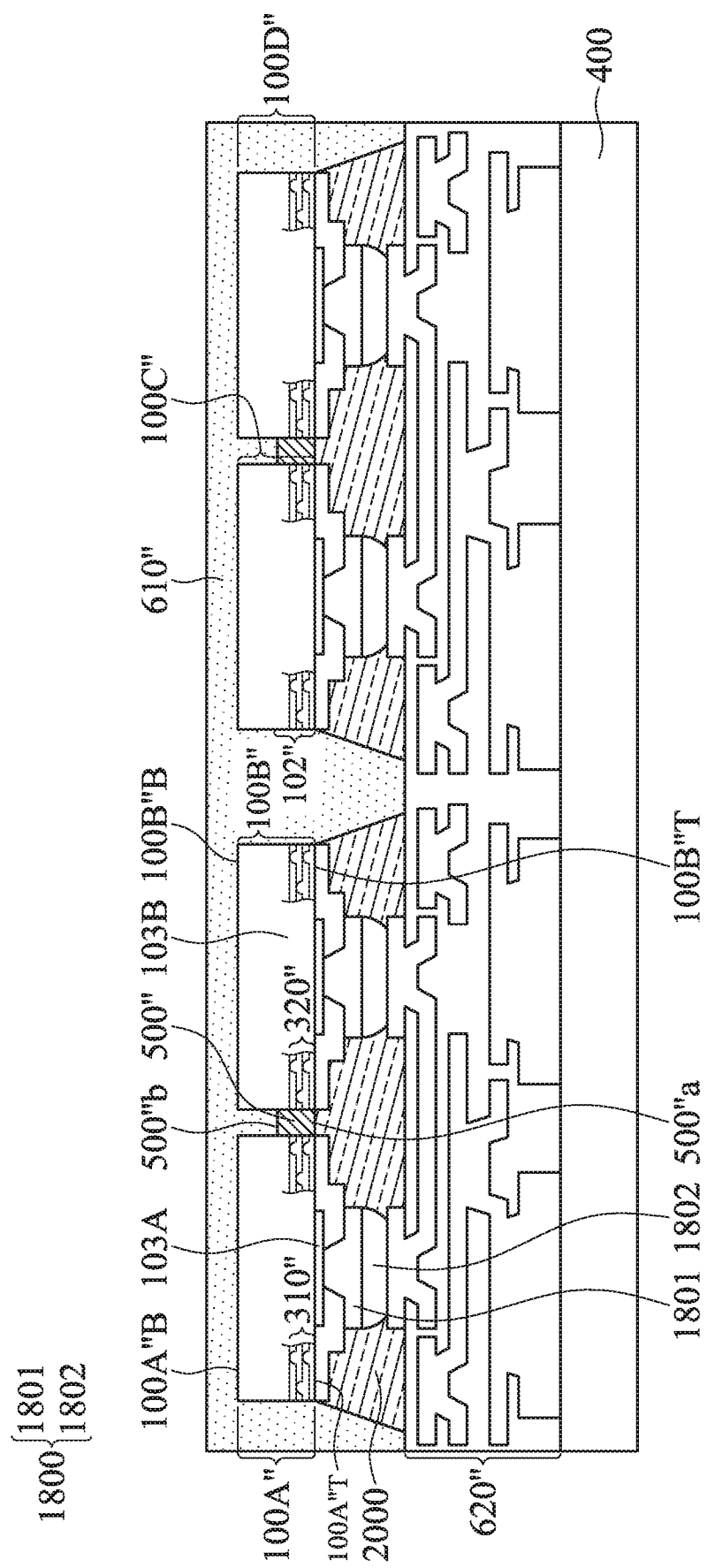

Referring to FIG. 20, a molding compound layer 610" is formed to encapsulate the semiconductor dies (e.g. the semiconductor dies 100A"/100B"/100C"/100D") after the formation of the inter-die connector 500", wherein the second surface 500"b of the inter-die connector 500" is in contact with the molding compound layer 610". Specifically, the molding compound layer 610" encapsulates the sidewall surfaces and the back side 100A"B of the semiconductor die 100A", the sidewall surface and the back side 100B"B of the semiconductor die 100B", and the underfill material 2000, wherein the molding compound layer 610" fills the first gap G1 not filled by the inter-die connector 500" and is in contact with the second surface 500"b of the inter-die connector 500".

Figure 21:
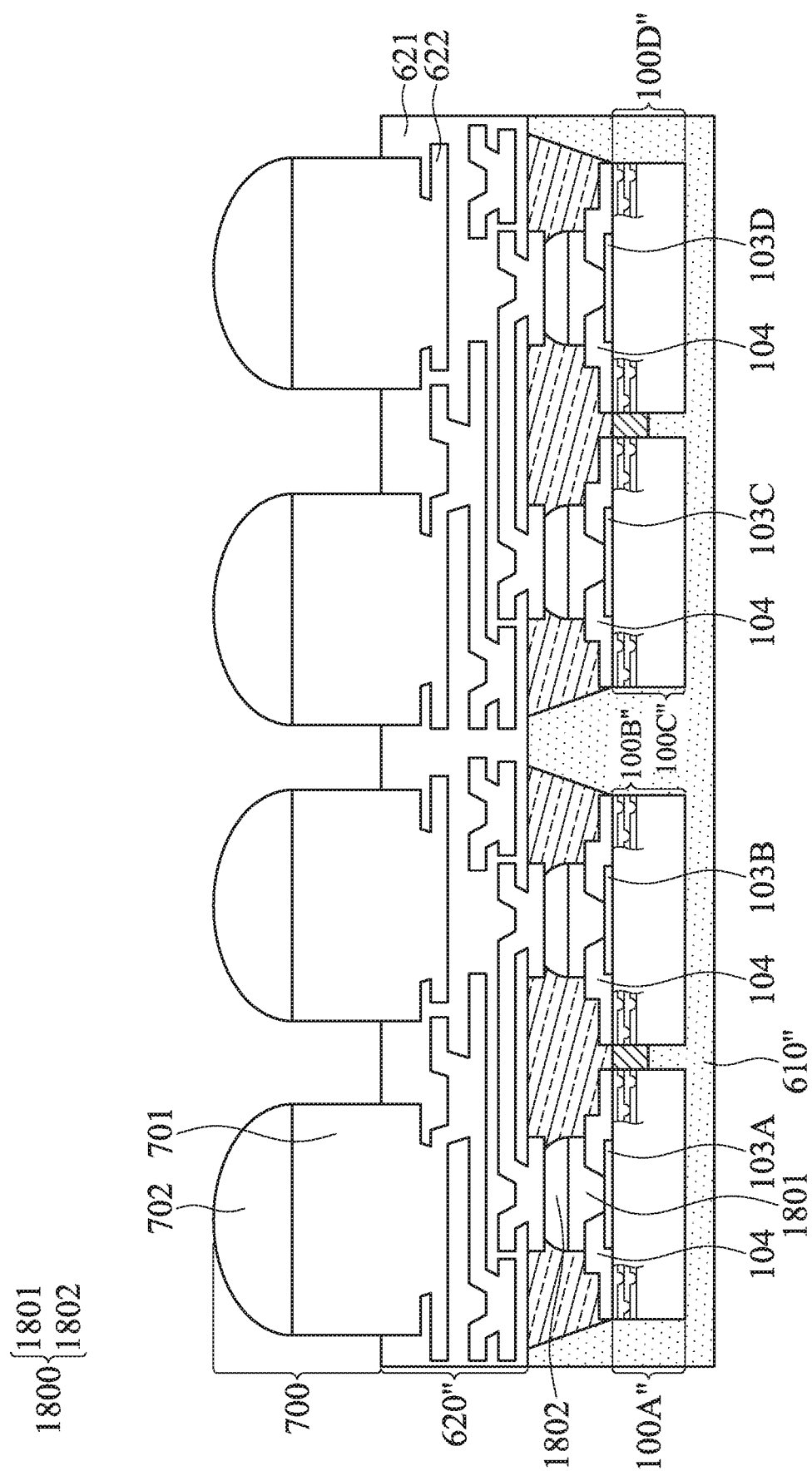

Referring to FIG. 21, the structure illustrated in FIG. 20 is flipped upside down, and the carrier substrate 400 is removed to form a plurality of conductive structures 700 over the front sides of the semiconductor dies and in contact with the redistribution layer 620" which is respectively electrically coupled to the semiconductor dies (e.g. the semiconductor dies 100A"/100B"/100C"/100D") through the plurality of conductive bumps 1800 formed on the front sides of the semiconductor dies. It should be noted that the material and method for forming the conductive structures 700 may be selected from those of the conductive structures 700 with respect to FIG. 7. The details are not repeated for brevity.

Referring to FIG. 22, a dicing process is performed to form individual semiconductor package structures 800A"/800B" by cutting through the redistribution layer 620" and a portion of the molding compound layer 610" which fills the second gap G2. As shown in FIG. 22, the semiconductor package structure 800A" includes the semiconductor die 100A" and the semiconductor die 100B", and the semiconductor package structure 800B" includes the semiconductor die 100C" and the semiconductor die 100D". According to some embodiments of the present disclosure, the semiconductor die 100A" and the semiconductor die 100B" may have the same functionalities (as discussed with respect to FIG. 25). In other embodiments, the semiconductor die 100A" and the semiconductor die 100B" may have different functionalities (as discussed with respect to FIG. 26).

As described above, the arrangement of the inter-die connector is also applicable to the embodiments provided in FIGS. 16-22 of the present disclosure. By the arrangement of the inter-die connector to form an electrical connection between two adjacent dies, the grounding lines of the two adjacent dies can be electrically connected directly through the inter-die connector without through additional redistribution layers, such that the conductive path between the two adjacent dies can be effectively reduced, thereby reducing the crosstalk and parasitic inductance between the additional redistribution layers in the semiconductor package structure with high integration density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a first semiconductor die, comprising:
      a first edge;
      a second edge opposite the first edge; and
      a first metal layer exposed from the second edge;
   a second semiconductor die neighboring the first semiconductor die, comprising:
      a third edge neighboring the second edge of the first semiconductor die;
      a fourth edge opposite the third edge; and
      a second metal layer exposed from the third edge;
   a first pad disposed on a front side of the first semiconductor die;
   a second pad disposed on a front side of the second semiconductor die; and
   an inter-die connector disposed between the first metal layer of the first semiconductor die and the second metal layer of the second semiconductor die to form an electrical connection;
   wherein the first metal layer of the first semiconductor die is in the electrical connection with the second metal layer of the second semiconductor die, the first pad and the first metal layer are disposed on opposite sides of the front side of the first semiconductor die, the second pad and the second metal layer are disposed on opposite sides of the front side of the second semiconductor die, the inter-die connector comprises a first surface adjacent to the front side of the first semiconductor die and the front side of the second semiconductor die and a second surface away from the front side of the first semiconductor die and the front side of the second semiconductor die, and the second surface of the inter-die connector is lower than a bottom surface of the first metal layer and a bottom surface of the second metal layer.

2. The semiconductor package structure as claimed in claim 1, further comprising a redistribution layer disposed over and adjacent to the front side of the first semiconductor die and the front side of the second semiconductor die.

3. The semiconductor package structure as claimed in claim 2, further comprising a plurality of bumps respectively disposed on the front side of the first semiconductor die and the front side of the second semiconductor die, wherein the redistribution layer is electrically connected to the first semiconductor die and the second semiconductor die respectively by the plurality of bumps.

4. The semiconductor package structure as claimed in claim 1, wherein the first surface of the inter-die connector is substantially level with a top surface of the first metal layer and a top surface of the second metal layer.

5. The semiconductor package structure as claimed in claim 1, wherein the second surface of the inter-die connector is coplanar with a back side of the first semiconductor die and a back side of the second semiconductor die.

6. The semiconductor package structure as claimed in claim 1, wherein the first surface of the inter-die connector protrudes beyond the front side of the first semiconductor die and the front side of the second semiconductor die.

7. The semiconductor package structure as claimed in claim 6, wherein the inter-die connector partially fills a gap between the first semiconductor die and the second semiconductor die.

8. The semiconductor package structure as claimed in claim 1, further comprising:
   a plurality of bumps respectively disposed on the front side of the first semiconductor die and the front side of the second semiconductor die;
   a redistribution layer electrically connected to the first semiconductor die and the second semiconductor die respectively by the plurality of bumps; and
   a molding compound layer encapsulating the first semiconductor die and the second semiconductor die.

9. The semiconductor package structure as claimed in claim 8, wherein each of the plurality of bumps comprises a first conductive material and a second conductive material disposed on the first conductive material, wherein the second conductive material is different from the first conductive material.

10. A semiconductor package structure, comprising:
    a first semiconductor die, comprising:
       a first edge;
       a second edge opposite the first edge; and a first metal layer exposed from the second edge;
a second semiconductor die neighboring the first semiconductor die, comprising:
  a third edge neighboring the second edge of the first semiconductor die;
  a fourth edge opposite the third edge; and
  a second metal layer exposed from the third edge;
a first pad disposed on a front side of the first semiconductor die;
a second pad disposed on a front side of the second semiconductor die;
an inter-die connector disposed between the first metal layer of the first semiconductor die and the second metal layer of the second semiconductor die to form an electrical connection; and
a molding compound layer encapsulating the first semiconductor die and the second semiconductor die;
wherein the first metal layer of the first semiconductor die is in the electrical connection with the second metal layer of the second semiconductor die, the first pad and the first metal layer are disposed on opposite sides of the front side of the first semiconductor die, the second pad and the second metal layer are disposed on opposite sides of the front side of the second semiconductor die, the inter-die connector comprises a first surface adjacent to the front side of the first semiconductor die and the front side of the second semiconductor die and a second surface away from the front side of the first semiconductor die and the front side of the second semiconductor die, the first surface of the inter-die connector protrudes beyond the front side of the first semiconductor die and the front side of the second semiconductor die, the inter-die connector partially fills a gap between the first semiconductor die and the second semiconductor die, and the molding compound layer fills the gap not filled by the inter-die connector and is in contact with the second surface of the inter-die connector.

11. A semiconductor package structure, comprising:
a first semiconductor die, comprising:
  a first edge;
  a second edge opposite the first edge; and
  a first metal layer exposed from the second edge;
a second semiconductor die neighboring the first semiconductor die, comprising:
  a third edge neighboring the second edge of the first semiconductor die;
  a fourth edge opposite the third edge; and
  a second metal layer exposed from the third edge;
a first pad disposed on a front side of the first semiconductor die;
a second pad disposed on a front side of the second semiconductor die; and
an inter-die connector disposed between the first metal layer of the first semiconductor die and the second metal layer of the second semiconductor die to form an electrical connection;
a plurality of bumps respectively disposed on the front side of the first semiconductor die and the front side of the second semiconductor die;
a redistribution layer electrically connected to the first semiconductor die and the second semiconductor die respectively by the plurality of bumps;
a molding compound layer encapsulating the first semiconductor die and the second semiconductor die; and
an underfill material surrounding the plurality of bumps;
wherein the first metal layer of the first semiconductor die is in the electrical connection with the second metal layer of the second semiconductor die, the first pad and the first metal layer are disposed on opposite sides of the front side of the first semiconductor die, the second pad and the second metal layer are disposed on opposite sides of the front side of the second semiconductor die, the inter-die connector comprises a first surface adjacent to the front side of the first semiconductor die and the front side of the second semiconductor die and a second surface away from the front side of the first semiconductor die and the front side of the second semiconductor die, the first surface of the inter-die connector is in contact with the underfill material, and the second surface of the inter-die connector is in contact with the molding compound layer.

* * * * *